United States Patent
Thomas et al.

(10) Patent No.: US 12,393,834 B2
(45) Date of Patent: Aug. 19, 2025

(54) OPTOELECTRONIC SYNAPSE BASED ON PEROVSKITE QUANTUM DOT-CARBON NANOTUBE FOR NEUROMORPHIC COMPUTING

(71) Applicant: University of Central Florida Research Foundation, Inc., Orlando, FL (US)

(72) Inventors: Jayan Thomas, Orlando, FL (US); Jinxin Li, Orlando, FL (US); Priyanka Dwivedi, Orlando, FL (US)

(73) Assignee: University of Central Florida Research Foundation, Inc, Orlando, FL (US)

( * ) Notice: Subject to any disclaimer, the term of this patent is extended or adjusted under 35 U.S.C. 154(b) by 1010 days.

(21) Appl. No.: 17/474,761

(22) Filed: Sep. 14, 2021

(65) Prior Publication Data

US 2022/0083850 A1 Mar. 17, 2022

Related U.S. Application Data

(63) Continuation of application No. 17/019,737, filed on Sep. 14, 2020, now Pat. No. 11,574,177.
(Continued)

(51) Int. Cl.
*H10F 77/14* (2025.01)
*G06N 3/049* (2023.01)
(Continued)

(52) U.S. Cl.
CPC ........... *G06N 3/0675* (2013.01); *G06N 3/049* (2013.01); *H10F 10/169* (2025.01);
(Continued)

(58) Field of Classification Search
CPC .... G06N 3/0675; G06N 3/049; H10F 10/169; H10F 30/282; H10F 71/00; H10F 77/1433; H10K 30/00; H10K 85/50
See application file for complete search history.

(56) References Cited

U.S. PATENT DOCUMENTS

2008/0066802 A1\* 3/2008 Reddy ................. H10K 85/225
136/258
2010/0025662 A1\* 2/2010 Cho ....................... B82Y 30/00
257/E51.026

(Continued)

FOREIGN PATENT DOCUMENTS

| CN | 106653850 | | 5/2017 |
| CN | 109037388 | | 12/2018 |
| CN | 110718633 | A * | 1/2020 |

OTHER PUBLICATIONS

Basudev Pradhan et al., "Ultrasensitive and ultrathin phototransistors and photonic synapses using perovskite quantum dots grown from graphene lattice" Science Advances Feb. 12, 2020.
(Continued)

*Primary Examiner* — Jeff W Natalini
*Assistant Examiner* — Brandon C Fox
(74) *Attorney, Agent, or Firm* — Fleit Intellectual Property Law; Jon Gibbons

(57) ABSTRACT

A photodetector device to act as an artificial photonic synapse includes a substrate and a perovskite quantum dot-multiwall carbon nanotube (PQD-MWCNT) hybrid material. The PQD-MWCNT hybrid material channel is disposed on the substrate between a first electrode and a second electrode and forms a PQD-MWCNT channel. The PDQs comprise a methylammonium lead bromide material. A method of operating the photodetector device as an artificial photonic synapse includes applying a presynaptic signal as stimuli as one or more light pulses on the PQD-
(Continued)

MWCNT channel between the first electrode and the second electrode. A current across the PQD-MWCNT channel is measured to represent a postsynaptic signal.

20 Claims, 18 Drawing Sheets

Related U.S. Application Data

(60) Provisional application No. 63/077,896, filed on Sep. 14, 2020.

(51) Int. Cl.
```
G06N 3/067      (2006.01)
H10F 10/16      (2025.01)
H10F 30/282     (2025.01)
H10F 71/00      (2025.01)
H10K 30/00      (2023.01)
H10K 85/50      (2023.01)
```
(52) U.S. Cl.
CPC ........... *H10F 30/282* (2025.01); *H10F 71/00* (2025.01); *H10F 77/1433* (2025.01); *H10K 30/00* (2023.02); *H10K 85/50* (2023.02)

(56) References Cited

U.S. PATENT DOCUMENTS

| | | | | |
|---|---|---|---|---|
| 2010/0133471 | A1* | 6/2010 | Newkome | B82Y 10/00 252/301.36 |
| 2019/0304705 | A1* | 10/2019 | Yu | H10K 85/50 |
| 2021/0171829 | A1* | 6/2021 | Chiang | C09K 11/02 |

OTHER PUBLICATIONS

Shuangyi Zhao et al., "Developing near-infrared quantum-dot light-emitting diodes to mimic synaptic plasticity", Science China Materials May 31, 2019.
Shuangyi Zhao et al., "Improving near-infrared quantum-dot light-emitting diodes to mimic synaptic plasticity", Supplementary Information 2019.
Youngbin Lee et al., "High-Performance Perovskite-Graphene Hybrid Photodetector", Advanced Materials, pp. 27, 41-46 2015.
Youngbin Lee et al., "High-Performance Perovskite-Graphene Hybrid Photodetector", Advanced Materials, Supporting Information 2015.
Yan Wang et al., "Photonic Synapses Based on Inorganic Perovskite Quantum Dots for Neuromorphic Computing", Photonic Flash Memory, Advanced Materials 2018.
Yan Wang et al., "Photonic Synapses Based on Inorganic Perovskite Quantum Dots for Neuromorphic Computing", Photonic Flash Memory, Advanced Materials, Supporting Materials 2018.
F. Bonaccorso et al., "Graphene photonics and optoelectronics", Nature Photonics, Review Article Aug. 31, 2010.
Michael C. Brennan et al., "Existence of a Size-Dependent Stokes Shift in CsPbBr3 Perovskite Nanocrystals", ACS Publications, pp. 1487-1488 2017.
Weiqiang Chen et al., "Giant five-photon absorption from multidimensional core-shell halide perovskite colloidal nanocrystals", Nature Communications May 12, 2017.
Wei Deng et al., "Organometal Halide Perovskite Quantum Dot Light-Emitting Diodes", Material Views 2016.
A. K. Geim et al., "The rise of graphene", Nature Materials, pp. 183-191 Mar. 2007.
Chun Xian Guo et al., Graphene Based Materials: Enhancing Solar Energy Harvesting, Advanced Energy Materials 2011.
Son-Tung Ha et al., "Metal halide perovskite nanomaterials: synthesis and applications", Chemical Science 2017.
Yasser Hassan et al., "Structure-Tuned Lead Halide Perovskite Nanocrystals", Advanced Materials, pp. 566-573 2016.
Xin Hu et al., "High-Performance Flexible Broadband Photodetector Based on Organolead Halide Perovskite", Advanced Function Material, pp. 7374-7380 2014.
Tom C. Jellicoe et al., "Synthesis and Optical Properties of Lead-Free Cesium Tin Halide Perovskite Nanocrystals", Journal of The American Chemical Society 2016.
Gerasimos Konstantatos et al., "Hybrid graphene-quantum dot phototransistors with ultrahigh gain", Nature Nanotechnology May 6, 2012.
Feng Li et al., "Ambipolar solution-processed hybrid perovskite phototransistors", Nature Communications Sep. 8, 2015.
X. Liu et al., "Highly Sensitive and fast Graphene Nanoribbons/CsPbBr3 Quantum Dots Phototransistor with Enhanced Vertically Metal Oxide Heterostructures", Nanoscale 2013.
Chang-Hua Liu et al., "Graphene photodetectors with ultra-broadband and high responsivity at room temperature", Nature Nanotechnology Mar. 16, 2014.
S.V. Morozov et al., "Giant Intrinsic Carrier Mobilities in Graphene and Its Bilayer", Physical Review Letters Jan. 11, 2008.
R. R. Nair et al., "Fine Structure Constant Defines Visual Transparency of Graphene", Science Mag, vol. 320 Jun. 6, 2008.
Robert A. Nawrocki et al., "A Mini Review of Neuromorphic Architectures and Implementations", IEEE Transactions on Electron Devices, vol. 63, No. Oct. 10, 2016.
Zhijun Ning et al., "Quantum-dot-in-perovskite solids", Nature, vol. 523 Jul. 16, 2015.
Rui Pan et al., "High-Responsivity Photodetectors Based on Formamidinium Lead Halide Perovskite Quantum Dot-Graphene Hybrid", Particle Particle Systems Characterization 2018.
Loredana Protesescu et al., Nanocrystals of Cesium Lead Halide Perovskites (CsPbX3, X = Cl, Br, and I): Novel Optoelectronic Materials Showing Bright Emission with Wide Color Gamut, Nano Letters, ACS Publications 2015.
Rinaldo Raccichini et al., "The role of graphene for electrochemical energy storage", Nature Materials, vol. Mar. 14, 2015.
Biddut K. Sarker et al., "Position-dependent and millimetre-range photodetection in phototransistors with micrometre-scale graphene on SiC", Nature Nanotechnology, vol. Jul. 12, 2017.
Frank Schwierz, "graphene transistors", Nature Nanotechology, Review Article May 30, 2010.
Yuchuan Shao et al., "Stable Graphene-Two-Dimensional Multiphase Perovskite Heterostructure Phototransistors with High Gain", Nano Letters, ACS Publications 2017.
Hsinyu Tsai et al., "Recent progress in analog memory-based accelerators for deep learning", Journal of Physics D: Applied Physics, IOP Publishing 2018.
Mark C. Weidman et al., "Monodisperse, Air-Stable PbS Nanocrystals via Precursor Stoichiometry Control", ACS Nano, vol. 8, No. 6, pp. 6363-6371 2014.
Fengnian Xia et al., "Ultrafast graphene photodetector", Nature Nanotechnology, vol. 4 Oct. 11, 2009.
Jun Xing et al., "High-Efficiency Light-Emitting Diodes of Organometal Halide Perovskite Amorphous Nanoparticles", ACS Publication 2016.
Feng Zhang et al., "Brightly Luminescent and Color-Tunable Colloidal CH 3 NH 3 PbX 3 (X = Br, I, Ci) Quantum Dots: Potential Alternatives for Display Technology", ACS Nano Mar. 2015.
Yongzhe Zhang et al., "Broadband high photoresponse from pure monolayer graphene photodetector", Nature Communications May 7, 2013.
Xiao-Liang Zhang et al., "Enhanced nonlinear optical properties of graphene-oligothiophene hybrid material", Optics Express, vol. 17, No. 26 Dec. 16, 2009.
Yong Sheng Zhao et al., "Low-Dimensional Nanomaterials Based on Small Organic Molecules: Preparation and Optoelectronic Properties", Advanced Materials, pp. 2859-2876 2008.
Hsinyu Tsai et al., "Recent progress in analog memory-based accelerators for Deep Learning", Author Submitted Manuscript 2018.
Sungho Kim et al., "Pattern Recognition Using Carbon Nanotube Synaptic Transistors with an Adjustable Weight Update Protocol", ACS Nano 2017.

(56) References Cited

OTHER PUBLICATIONS

Yusheng Wang et al., "Hybrid Graphene-Perovskite Phototransistors with Ultrahigh Responsivity and Gain", Material Views, Advanced Optical Material 2015.
Li Zheng et al., "Ambipolar Graphene-Quantum Dot Phototransistors with CMOS Compatibility", Ambipolar Phototransistors, Advanced Optical Material 2018.
Krishna Prasad Bera et al., "Trapped Photons Induced Ultrahigh External Quantum Efficiency and Photoresponsivity in Hybrid Graphene/Metal-Organic Framework Broadband Wearable Photodetectors", Wearable Photodetectors, Advanced Function Material, pp. 1804802-1804802 2018.
He Tian et al., "High Performance 2D Perovskite/Graphene Optical Synapses as Artificial Eyes" 2018.
Shuchao Qin et al., "A light-stimulated synaptic device based on graphene hybrid", 2D Materials 4, IOP Publishing 2017.
Shilei Dai et al., "Light-stimulated Synaptic Devices Utilizing Interfacial Effect of Organic Field-effect Transistors", ACS Applied Materials & Interfaces, ACS Publications Jun. 7, 2018.
Minkyung Lee et al., Brain-Inspired Photonic Neuromorphic Devices using Photodynamic Amorphous Oxide Semiconductors and their Persistent Photoconductivity, Advanced Materials, pp. 1700951-1700951 2017.
Youngbin Lee et al., "High-Performance Perovskite-Graphene Hybrid Photodetector", Material Views, Advanced Material, pp. 27, 41-46 2015.
Wei Geng et al., "Effect of surface composition on electronic properties of methylammonium lead iodide perovskite", Journal of Materiomics Apr. 23, 2015.
Xin Huang et al., "Electronic structure and stability of the $CH_{3}NH_{3}PbBr_{3}$ (001) surface", APS Physics Nov. 22, 2016.
Litao Sun et al., "Migration and Localization of Metal Atoms on Strained Graphene", Physical Review Letters Nov. 2010.
L. Li et al., "Defect energies of graphite: Density-functional calculations", Physical Review B 72, 184109 Nov. 30, 2005.
Jie Ma et al., "Stone-Wales defects in graphene and other planar sp2-bonded materials", Physical Review B 80, 033407 Jul. 17, 2009.
A. A. El-Barbary et al., "Structure and energetics of the vacancy in graphite", Physical Review B 68, 144107 Oct. 15, 2003.
Christopher Eames et al., "Ionic transport in hybrid lead iodide perovskite solar cells", Nature Communications Jun. 24, 2015.
Artem A. Bakulin et al., "Real-Time Observation of Organic Cation Reorientation in Methylammonium Lead Iodide Perovskites", ACS Publications, 3663-3669 Sep. 2, 2015.
Pradeep R. Varadwaj et al., "Why Do Eight Units of Methylammonium Enclose PbI6-Octahedron in Large-Scale Crystals of Methylammonium Lead Iodide Perovskite Solar Cell? An Answer from First-Principles Study" 2008.
Harold Y. Hwang et al., "Nonlinear THz Conductivity Dynamics in P-Type CVD-Grown Graphene", The Journal of Physical Chemistry, ACS Publications 2013.
Jahan M. Dawlaty et al., "Measurement of the optical absorption spectra of epitaxial graphene from terahertz to visible", Appl. Phys. Lett. 93, 131905 Sep. 30, 2008.
Paul A. George et al., "Ultrafast Optical-Pump Terahertz-Probe Spectroscopy of the Carrier Relaxation and Recombination Dynamics in Epitaxial Graphene", Nano Letters, vol. 8, No. 12, 4248-4251 Jul. 2, 2008.
Xudong Wang et al., "Ultrasensitive and broadband MoS2 photodetector driven by ferroelectrics", arXiv preprint arXiv:1502.04439 2015.
Tang, Y. et al. A Colloidal-Quantum-Dot Infrared Photodiode with High Photoconductive Gain. Small 14, 1803158 2018.
Gong, X. et al. High-detectivity polymer photodetectors with spectral response from 300 nm to 1450 nm. Science 325, 1665-1667 2009.
Li, F. et al. Ultrahigh Carrier Mobility Achieved in Photoresponsive Hybrid Perovskite Films via Coupling with Single-Walled Carbon Nanotubes. Advanced Materials 29, 1602432 2017.
Wang, Y. et al. Hybrid graphene-perovskite phototransistors with ultrahigh responsivity and gain. Advanced Optical Materials 3, 1389-1396 2015.
Zheng, L. et al. Ambipolar Graphene-Quantum Dot Phototransistors with CMOS Compatibility. Advanced Optical Materials 6, 1800985 2018.
Bera, K. P. et al. Trapped Photons Induced Ultrahigh External Quantum Efficiency and Photoresponsivity in Hybrid Graphene/Metal-Organic Framework Broadband Wearable Photodetectors. Advanced Functional Materials 28, 1804802 2018.
Kufer, D. et al. Hybrid 2D-0D MoS2-PbS quantum dot photodetectors. Advanced materials 27, 176-180 2015.
Rosencher, E. & Vinter, B. Optoelectronics Cambridge University Press. Cambridge, England, 300 2002.
Endres, J. et al. Valence and conduction band densities of states of metal halide perovskites: a combined experimental-theoretical study. The journal of physical chemistry letters 7, 2722-2729 2016.
Liu, X. et al. Graphene nanomesh photodetector with effective charge tunnelling from quantum dots. Nanoscale 7, 4242-4249 2015.
Liao, L. et al. Scalable fabrication of self-aligned graphene transistors and circuits on glass. Nano letters 12, 2653-2657 2011.
Wang, Y. et al. Photonic Synapses Based on Inorganic Perovskite Quantum Dots for Neuromorphic Computing. Advanced Materials 30, 1802883 2018.
Querlioz, D., Bichler, O., Dollfus, P. & Gamrat, C. Immunity to device variations in a spiking neural network with memristive nanodevices. IEEE Transactions on Nanotechnology 12, 288-295 2013.
Marder, E. & Goaillard, J.-M. Variability, compensation and homeostasis in neuron and network function. Nature Reviews Neuroscience 7, 563 2006.
Chan, J. et al. Reducing extrinsic performance-limiting factors in graphene grown by chemical vapor deposition. ACS nano 6, 3224-3229 2012.

\* cited by examiner

OPTOELECTRONIC SYNAPSE BASED ON PEROVSKITE QUANTUM DOT-CARBON NANOTUBE FOR NEUROMORPHIC COMPUTING

CROSS-REFERENCE TO RELATED APPLICATIONS

This application is related to the following prior U.S. Provisional Patent Application No. 63/077,896 entitled "Optoelectronic Synapse Based On Dot-Carbon Nanotube For Neuromorphic Computing" with inventors Jayan THOMAS et al., filed on Sep. 14, 2020, and U.S. patent application Ser. No. 17/019,737 entitled "Photonic Synapse Based On Graphene-Perovskite Quantum Dot For Neuromorphic Computing" with inventors Jayan THOMAS et al., filed on Sep. 14, 2020, the entire disclosures of the aforementioned applications are hereby incorporated into the present application by reference in their entirety.

STATEMENT REGARDING FEDERALLY SPONSORED RESEARCH

This invention was made with Government support under CAREER: ECCS-1351757 awarded by the National Science Foundation. The Government has certain rights in the invention.

BACKGROUND

The present application relates generally to neuromorphic computing and more specifically to an electronic device controlled by light for producing photonic synapses typically used in neuromorphic computing.

The traditional computing system, which is based on the von Neumann architecture, has demonstrated its power in solving problems related to well-formulated mathematical calculations. However, due to the physical separation of the calculation (processing) unit and the data storage (memory) unit, the architecture has an energy efficiency limit for high-speed data processing. In contrast, neuromorphic computing, also called brain-inspired computing, consumes low energy because the building block has the ability to simultaneously memorize and process the data. Currently, artificial neural networks show strength in complicated computational machine learning tasks such as image recognition, audio recognition, protein structure revealing and material discovery. These machine learning tasks rely on a large volume of data and high-speed data analysis. Therefore, compared to the traditional von Neumann architecture, brain-inspired computing architecture that mimics the basic elements of the biological brain (e.g., neurons and synapses) are emerging as a computing solution for complicated machine learning tasks. Among the component devices for the realization of neuromorphic computing, optoelectronic devices, which can act as building blocks of optoelectronic neuromorphic computers, need novel materials to make circuit-level and nanoscale level devices.

BRIEF DESCRIPTION THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

Figure 35:
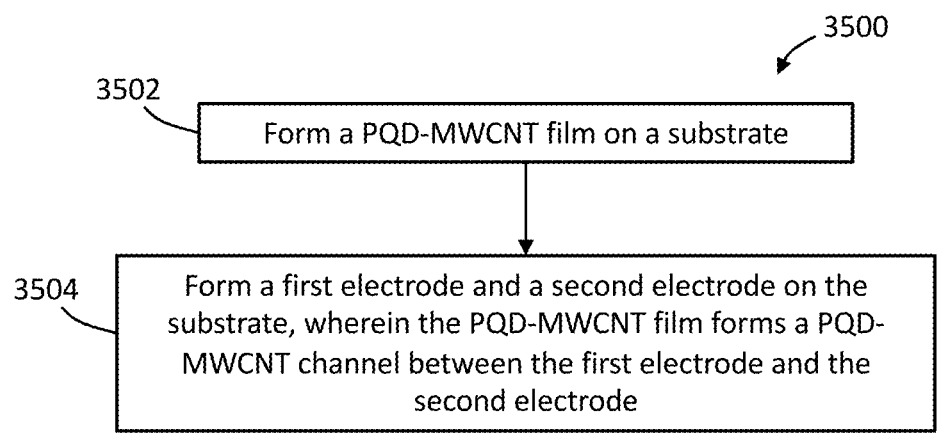
Figure 36:
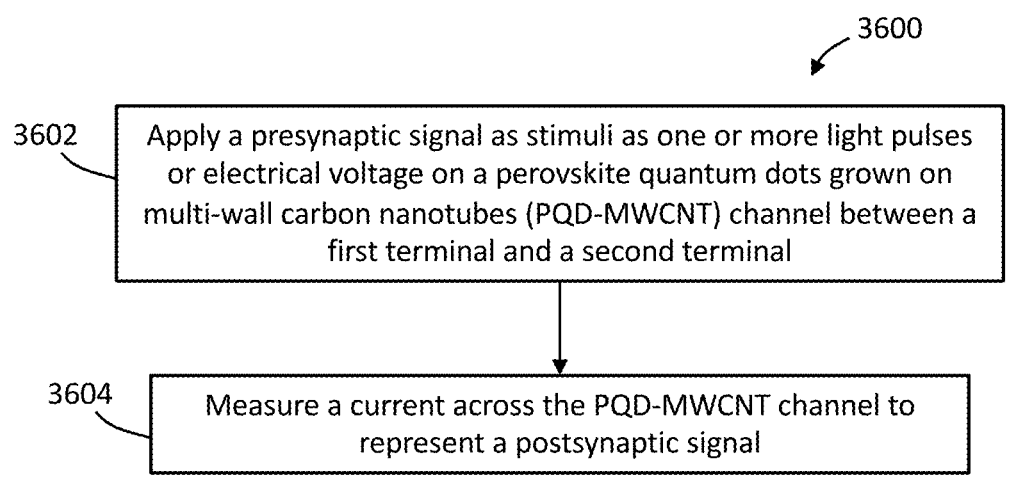

FIG. 35 is an operational flow diagram illustrating one example of a process/method for fabricating a light control photonic synapse device to act as an artificial photonic synapse in accordance with one or more embodiments; and FIG. 36 is an operational flow diagram illustrating one example of a process/method 3600 for operating a device having a light control photodetector device geometry to act as an artificial photonic synapse in accordance with one or more embodiments.

DETAILED DESCRIPTION

Overview

Brain-inspired neuromorphic computing offers lower energy consumption and parallelism of simultaneous processing and memorizing compared to von Neumann computing. Neuromorphic computing also does not have a power efficiency wall compared to the conventional Von Neumann structure and provides excellent opportunities in many computational tasks and applications. Examples of computational tasks include pattern recognition, image recognition, speech processing, image processing, image sensor and photosensors, cognitive computing, aerial photography, and so on. Examples of applications include defense, industrial automation, pattern recognition, autonomous vehicles, aerospace industries, companies making commercial sensors, image processing, neuro-robotics, drones, and more. Neuromorphic systems typically include software/hardware systems, which are utilized to mimic the biologically inspired concepts of the nervous systems based on human brain functionalities.

To accomplish neuromorphic computing, highly efficient optoelectronic synapses, which can be the building blocks of optoelectronic neuromorphic computers, are necessary. One candidate for developing circuit-level optoelectronic synapses is carbon nanotubes (CNT) technology. CNTs are commonly used in electronic devices because of their excellent mechanical and electrical properties. Unlike two-dimensional (2D) graphene materials that are used in devices as single or multi-layer films, one-dimensional (1D) CNTs have better potential for use in circuit-level and nanoscale device applications. As an electrical material with high carrier mobility, CNTs can be used to build field-effect transistors and computers. Despite the excellent electrical properties of CNTs (including multi-wall CNTs (MWCNTs)), their response to light is weak, and are not suitable for many optoelectronic applications on their own. MWCNTs have been recently used to realize photonic memory, but the light intensity used was as high as 40 W/cm2. Also, neat multi-wall CNTs (MWCNTs) have not shown any detectable light response at tested light intensity as high as 25 mW/cm2. This inferior light response motivates researchers to develop various approaches to improve the photoresponse. Unlike the current bilayer approach of depositing a light sensitive material like quantum dots (QDs) on top of a CNT layer, if QDs are grown on individual CNTs, it can lead to the development of a single CNT level optoelectronic device in the future. In some implementations, PQDs can be prepared on SWCNTs by mixing PQDs with SWCNTs. In these implementations, since PDQs are only mixed with SWCNTs, i.e., PQDs are not grown on SWCNTs, they observed only a three times enhancement of the light response for a drop casted film prepared without following any washing procedure.

Organic-inorganic halide perovskite quantum dots (PQDs) are also an attractive candidate for optoelectronic devices because they are good photocarrier generators, have high light absorption, good bandgap tunability, and easy fabrication. PQDs are used in advancing technologies such as solar cells, photodetectors, and memory devices. Recent reports show that photonic memory is possible in PQD systems, such as graphene-PQD, and inorganic CsPbBr3 PQD film. However, in most of these cases, an external gate voltage is required to manipulate the photonic memory effect.

Currently, extremely high-efficient optoelectronic synapses based on PQDs grown on a single MWCNT have not been developed. As such, one or more embodiments, provide a novel method to grow PQDs directly on MWCNTs for increasing the photosensitivity of optoelectronic synapses. The new hybrid material synchronizes the high photoresponse of PQDs and the excellent electrical properties of MWCNTs to provide photonic memory under very low light intensity (e.g., 125 μW/cm2). Since the PQDs are grown directly on and in the MWCNTs, the hybrid PQD-MWCNT provides a new direction for future nanoscale or single MWCNT-based optoelectronic neuromorphic computing and sensing devices. These new hybrid PQD-MWCNT-based optoelectronic devices for neuromorphic computing can eliminate the von Neumann bottleneck and are more efficient than regular electronic chips with similar power consumption.

As described in greater detail below, the photoresponse of PQDs and electrical properties of MWCNTs are combined, by growing PQDs directly on and from MWCNTs, without the need for an external gate voltage. Compared to other CNT devices that require very high light intensity to achieve a photoresponse, the hybrid PQD-MWCNT based device requires only low light intensity to achieve a significant increase in light response and photonic memory. At least some embodiments use single and multiple light pulses to stimulate the PQD-MWCNT device to demonstrate its potential for optoelectronic brain-inspired computing applications. As a result of the unique PQD-MWCNT structural architecture, the techniques and devices of one or more embodiments represent a significant step forward towards achieving nanoscale and single MWCNT optoelectronic neuromorphic devices that could one-day function as the channel for a two-terminal nano-device.

PQD-MWCNT Optoelectronic Devices

Figure 1:
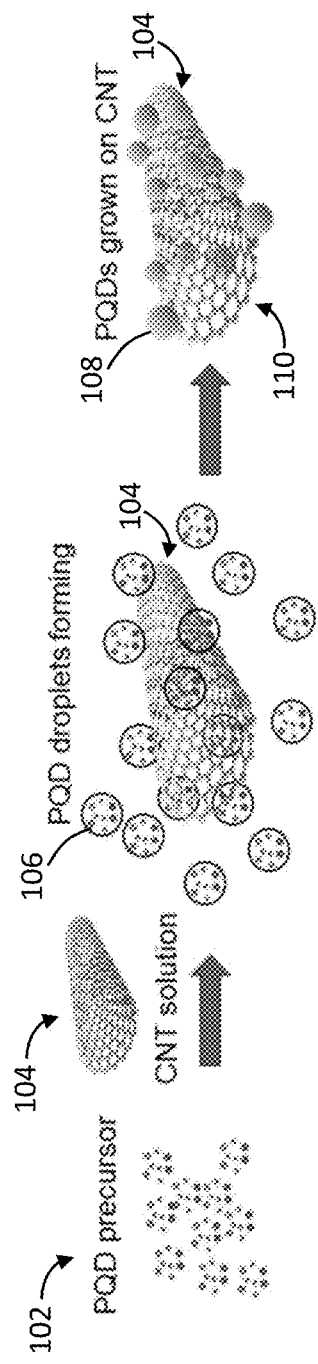
FIG. 1 is a graphical illustration representing the formation of a hybrid perovskite quantum dots-multi-wall carbon nanotube (PQD-MWCNT) material in accordance with one or more embodiments.

A heterogeneous nucleation approach, in at least some embodiments, is used to grow PQDs on MWCNTs. In at least some embodiments, MWCNTs with a diameter of about 20 nm is presumed to be more compatible for growing PQDs with a size of, for example, 3-7 nm compared to single-wall CNTs (SWCNTs) of about 3 nm diameter. The details of the material fabrication are provided in the Experimental Section below. Briefly, in at least some embodiments, a MAPbBr3 (methylammonium lead tribromide) PQD precursor solution 102 (17.3 mg MABr+73 mg PbBr2+5 mL DMF+300 μL butylamine+500 μL oleic acid) is mixed vigorously with MWCNTs 104 in toluene solution to generate numerous fine droplets 106, as shown in FIG. 1. The PQD precursor droplets 106 then collide with the surface of the MWCNT 104, initiating heterogeneous nucleation and subsequent growth of PQDs 108 from the MWCNT lattice 104 to form a PQD-MWCNT hybrid material 119. The PQDs 108 can overcome the activation free energy for stable nucleation and crystal growth because of the high Gibbs free surface energy of the MWCNT surface, particularly at defect sites.

Figure 3:
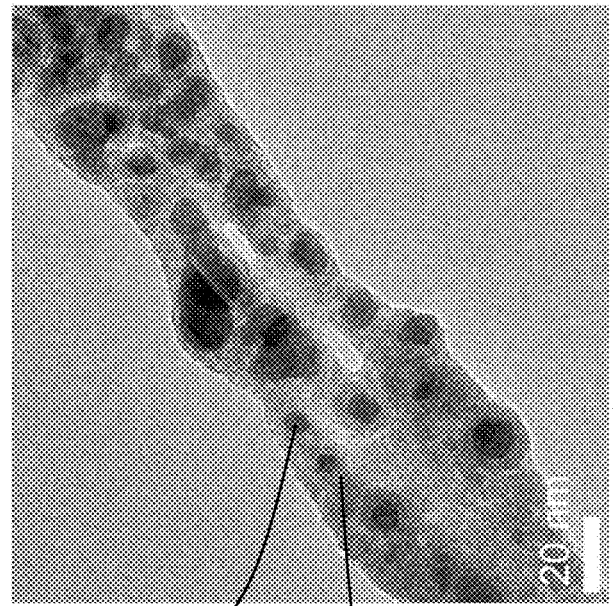
FIG. 2 and FIG. 3 are Transmission Electron Microscopy (TEM) images of the hybrid PQD-MWCNT material in accordance with one or more embodiments.
Figure 2:
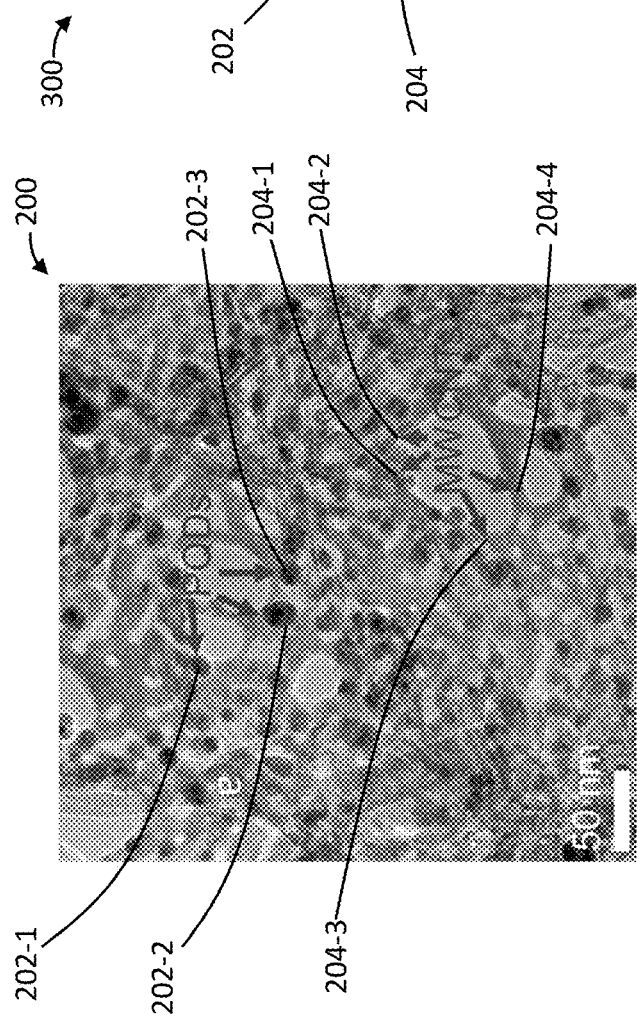
Figure 4:
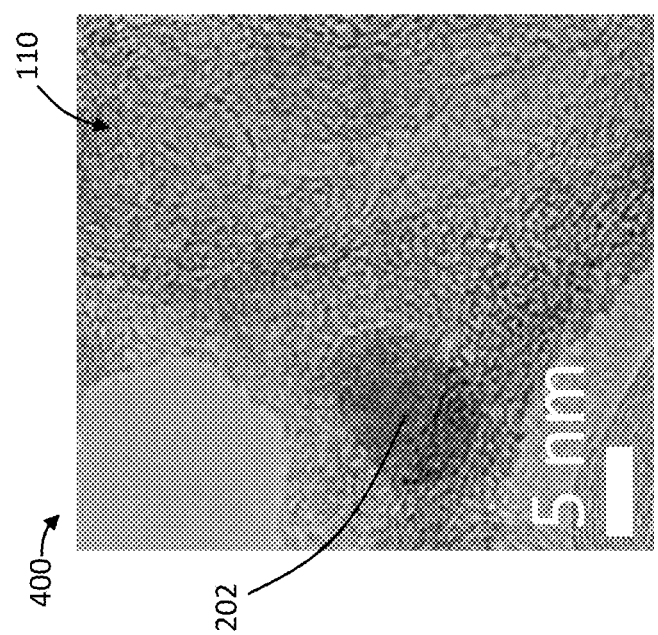
FIG. 4 is a TEM image of showing the crystal structure of PDQs in the hybrid PQD-MWCNT material in accordance with one or more embodiments.
Figure 7:
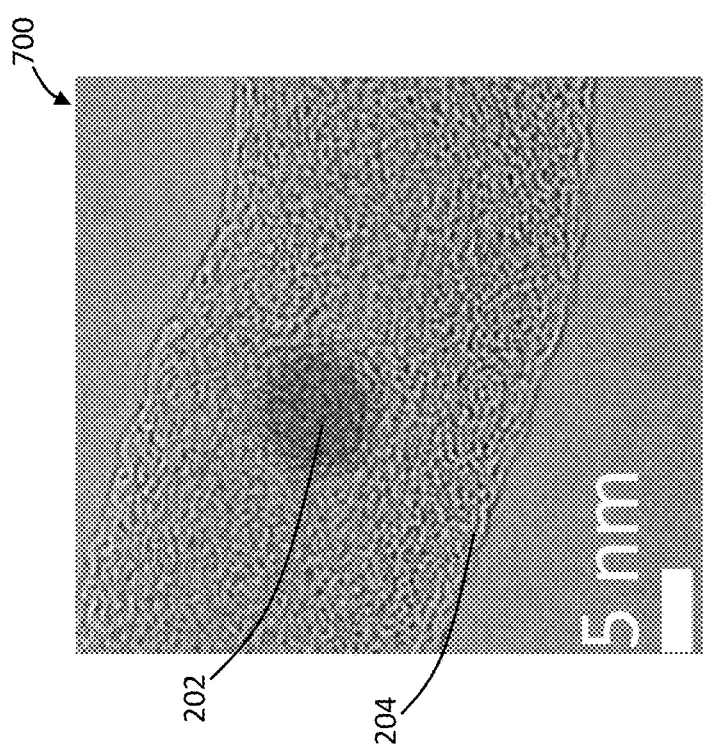
FIG. 7 is a TEM image of a PDQ grown inside a CNT in accordance with one or more embodiments.

FIG. 2 and FIG. 3 show transmission electron microscopy (TEM) images characterizing the PQD-MWCNT hybrid material 110. More specifically FIG. 2 is a TEM image 200 showing the PQDs 202 (illustrated as PDQs 202-1 to 202-4) randomly grown on MWCNTs 204 (illustrated as MWCNTs 204-1 to 204-4). FIG. 3 is a zoom image 300 of FIG. 2 that shows PQDs 202 grown along MWCNTs 204. FIG. 4 is a TEM image 400 of the hybrid material 110 and clearly shows the crystal structure of the PQDs 202. In at least some embodiments, the lattice spacing of PQDs 202 on MWCNTs 204 is about 0.26 nm Considering the heterogeneous nucleation method, the PQD size variation may be due to different Gibbs surface free energy of various sites on MWCNTs. Absorption and photoluminescence (PL) experiments, represented in graph 500 of FIG. 5 and graph 600 of FIG. 6, respectively, further confirm the PQDs 202 have different sizes. In one or more embodiments, some small PQDs 202 may grow inside the channel of MWCNTs 204, as shown in the TEM image 700 of FIG. 7. In these instances, the PQDs 202 may have grown inside the MWCNT channel because the edges of MWCNT 204 and the PQD 202 are almost at the same focal plane as the focus of the electron beam of the TEM is tuned.

Figure 5:
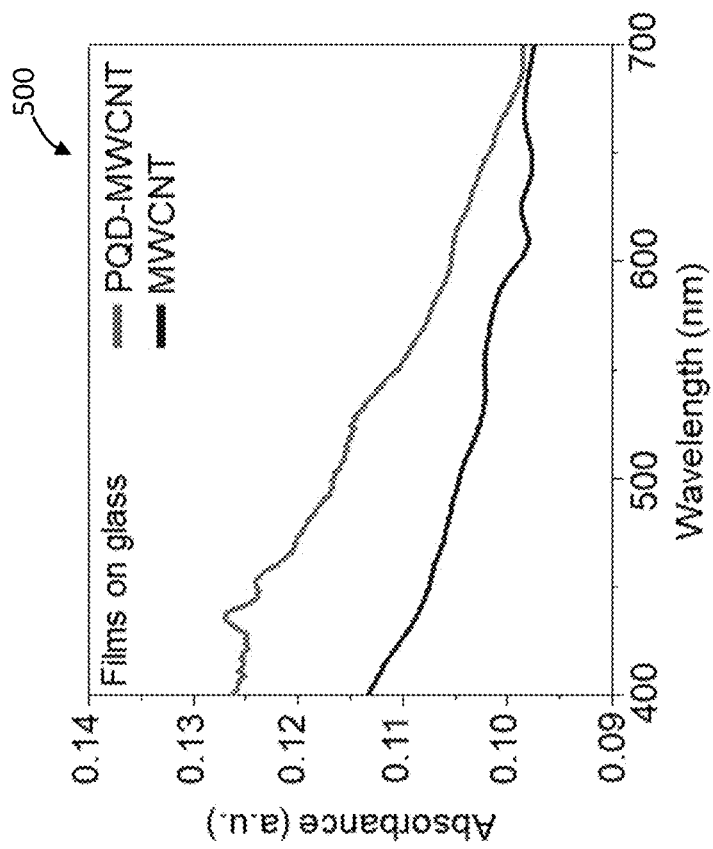
FIG. 5 is a graph of absorption spectra of MWCNT and PQD-MWCNT film on glass in accordance with one or more embodiments.
Figure 6:
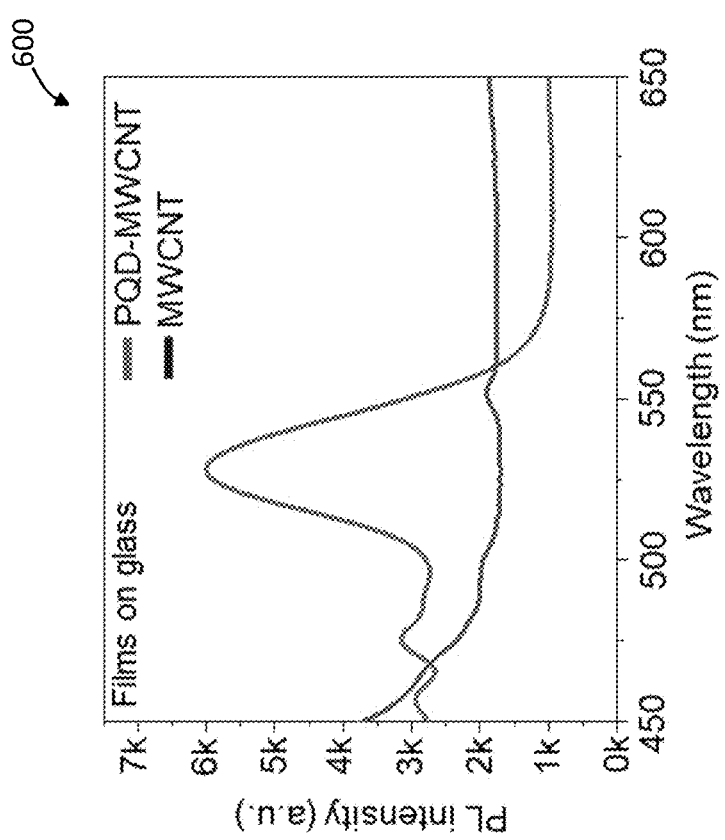
FIG. 6 is a graph of photoluminescence (PL) spectra of MWCNT and PQD-MWCNT films on glass in accordance with one or more embodiments.
Figure 9:
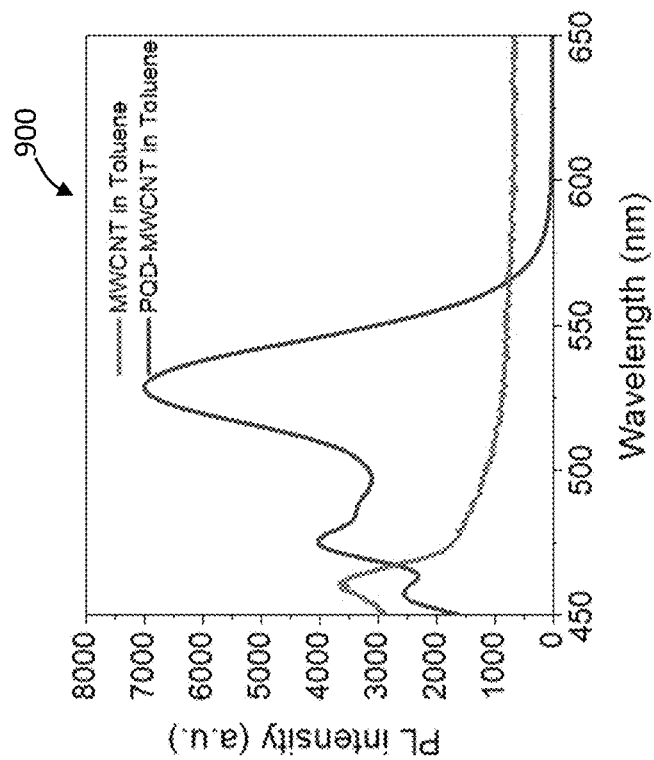
FIG. 9 is an image of PL spectra of CNT, PQD-CNT in toluene and toluene itself using 405 nm excitation in accordance with one or more embodiments.
Figure 8:
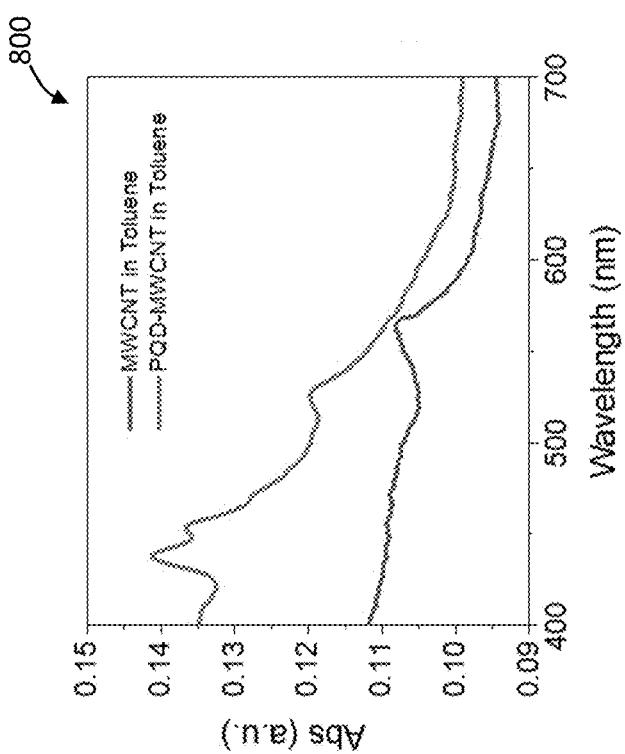
FIG. 8 is a graph of absorption spectra of CNT, PQD-CNT in toluene in accordance with one or more embodiments.

The presence of PQDs 202 on MWCNTs 204 can also be understood from the optical absorption and PL characteristics. For example, FIG. 5 shows a graph 500 of the absorption spectra of a MWCNT film on glass and PQD-MWCNT hybrid material film on the glass (solution absorption spectra with similar findings for both materials in toluene are illustrated in graph 800 of FIG. 8 and graph 900 of FIG. 9). The baseline correction of the absorption spectra is done with bare glass substrates. In the absorption spectrum of the PQD-MWCNT hybrid material film on glass, two peaks at 437 nm and 453 nm is observed. These two peaks are the absorption peaks of PQDs 202 grown on MWCNTs 204. These absorption peaks are likely due to the different sizes of the PQDs 202 grown from MWCNTs 204. The PL spectra, at 405 nm excitation, of the same PQD-MWCNT hybrid material film sample yields mainly two PL peaks, 475 nm and 530 nm, that correlate to bandgaps of 2.4 eV and 2.6 eV, respectively shown in 6. The smaller peaks between 475 nm and 530 nm should correspond to different PQD sizes grown on MWCNTs.

Figure 10:
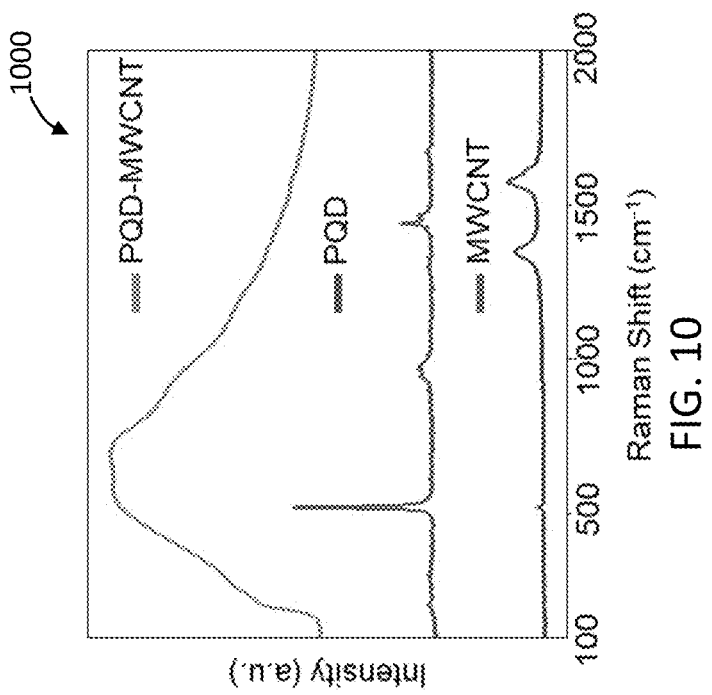
FIG. 10 is a graph of Raman spectra of PQD-MWCNT, PQD, and MWCNT films on silicon in response to an excitation of 514 nm laser source in accordance with one or more embodiments.

Graph 1000 of FIG. 10 shows a Raman spectroscopy of films comprising PQD, MWCNT, and PQD-MWCNT on silicon substrates using 514 nm excitation wavelength. The Raman peak at around 520 cm-1 is from the signal due to the silicon substrate in all the samples. The peaks at 1347 cm-1 and 1576 cm-1 of MWCNT matches well with published data. The Raman peaks of MAPbBr3 PQDs at 970 cm-1, 1438 cm-1, 1465 cm-1 are very close to reported values. It can be seen that the Raman spectrum of the PQD-MWCNT hybrid material film of one or more embodiments is overlapped and different from those of the individual MWCNTs and PQDs. When QDs size varies, the Raman peak position could shift due to the quantum effect and surface effect. Also, unlike bulk material, the Raman spectrum of QDs could be broadened due to phonon confinement effect. Overall, the broad Raman spectrum of PQD-MWCNT may stem from the complicated vibrational modes and phonon confinement that results from the different sizes of QDs and the attachment of PQDs to MWCNTs.

Figure 11:
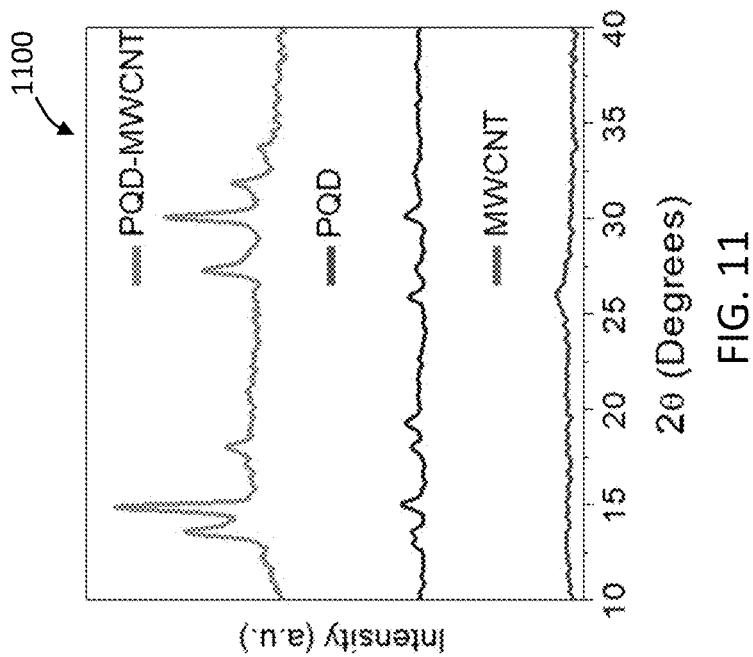
FIG. 11 is a graph of X-ray powder diffraction (XRD) spectra of PQD-MWCNT, PQD, and MWCNT films on silicon in accordance with one or more embodiments.

The XRD patterns of MWCNT, PQD, and PQD-MWCNT materials are shown in graph 1100 of FIG. 11. The characteristic peak of MWCNT appeared at 2θ of 26.00° corresponding to (002) crystal planes. The formation of orthorhombic MAPbBr3 QDs is confirmed by the presence of the characteristic diffraction peaks at 2θ of 15.1°, 25.9°, 27.2°, 30.16° and 31.5° corresponding to (101), (131), (040) and (212) crystal planes respectively. The peak seen at 17.9° can be attributed to the presence of excess PbBr2 from the precursor solution. The XRD pattern of the PQD-MWCNT hybrid material clearly exhibits the characteristic peaks of MAPbBr3 QDs confirming the growth of the QDs on CNT and the high intensity of QD peaks confirm the crystalline nature of the composite formed. The MWCNT peak lies in the noise level of the high intense QD peaks. A comparison XRD plot for CNT and QDs on CNT is given in graph 1200 of FIG. 12.

Figures 12, 13:
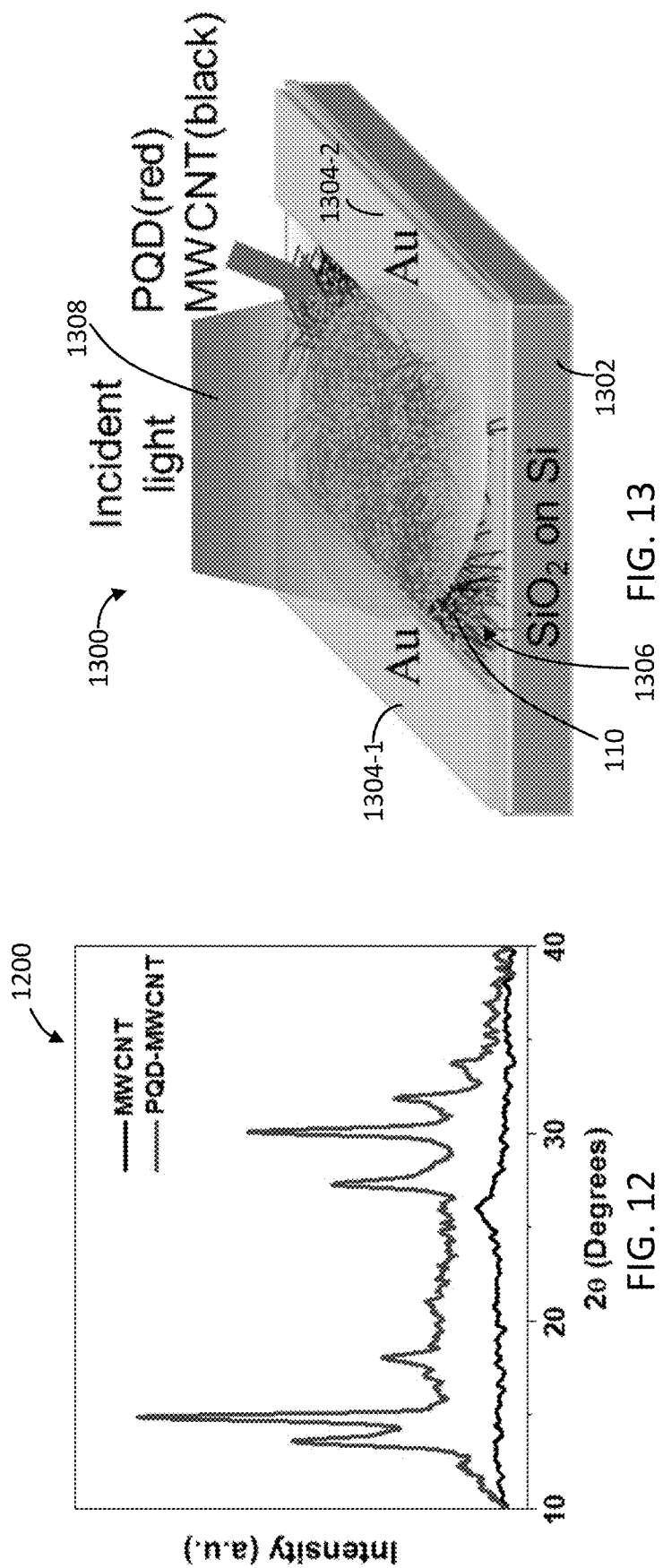
FIG. 12 is a graph of XRD comparison between MWCNT and PQD-MWCNT films in accordance with one or more embodiments.
FIG. 13 is a schematic of PQD-MWCNT photonic synapse device in accordance with one or more embodiments.

FIG. 13 shows one example of a semiconductor device 1300 (also referred to as "PQD-MWCNT device 1300"), such as a two-terminal optoelectronic synapse (photodetector) device 1300, comprising the PQD-MWCNT hybrid material 110 according to one or more embodiments. In the example shown in FIG. 13, the PQD-MWCNT device 1300 comprises a substrate 1302 that includes, for example, a silicon (Si) on silicon dioxide ($SiO_2$) layer(s). However, other substrate materials are applicable as well. In at least some embodiments, the PQD-MWCNT device 1300 includes two terminals/electrodes 1304 (illustrated as terminals 1304-1 and 1304-2) that are separated by a channel 106 comprising the PQD-MWCNT hybrid material film 110 formed on the substrate 1302. In this example, the PQD-MWCNT device 1300 does not comprise gate terminals, which is different from other CNT reports where a gate voltage is applied to achieve photonic memory. In at least some embodiments, the two terminals 1304 each comprise gold (Au) or other applicable material. FIG. 13 further shows light 1308 incident to the PQD-MWCNT device 1300.

It should be understood that embodiments are not limited to the semiconductor structure of the PQD-MWCNT device 1300 illustrated in FIG. 13, as other semiconductor structures are applicable as well. For example, the PQD-MWCNT device 1300, in other embodiments, may be a phototransistor device (not shown) comprising three terminals (e.g., source, drain, and gate). In this example the PQD-MWCNT device 1300 comprises a substrate including a silicon layer and a $SiO_2$ layer, or other applicable substrate materials, formed thereon. A source layer and a drain layer are formed on the substrate. The PQD-MWCNT device 1300 further comprises a PQD-MWCNT hybrid material film formed as the channel of the device. A gate voltage of the phototransistor device can be tuned resulting in a higher conducting state of the light control phototransistor device achieved under light illumination across the PQD-MWCNT source-drain channel and retained even in an absence of light enabling potential application in neuromorphic computing.

Figure 15:
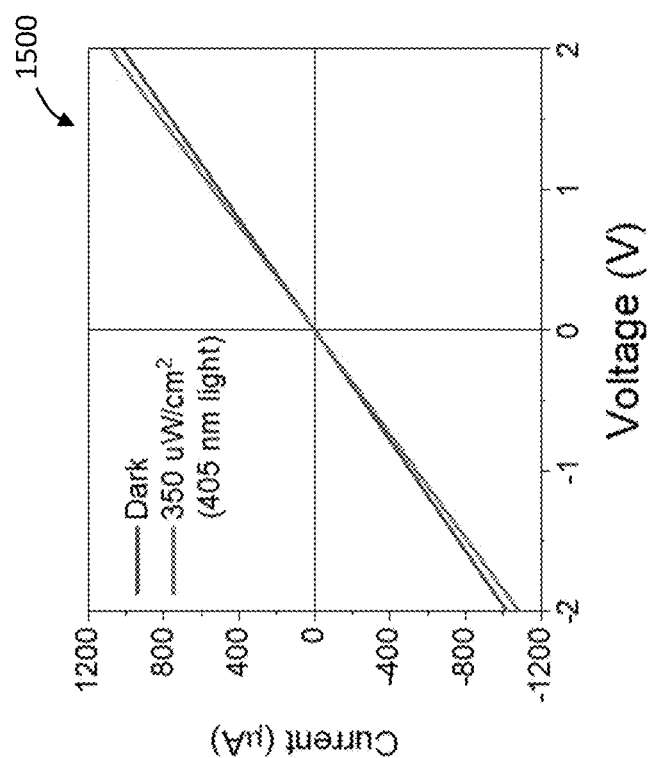
FIG. 15 is a graph of I-V curve of our device under dark and light in accordance with one or more embodiments.
Figure 14:
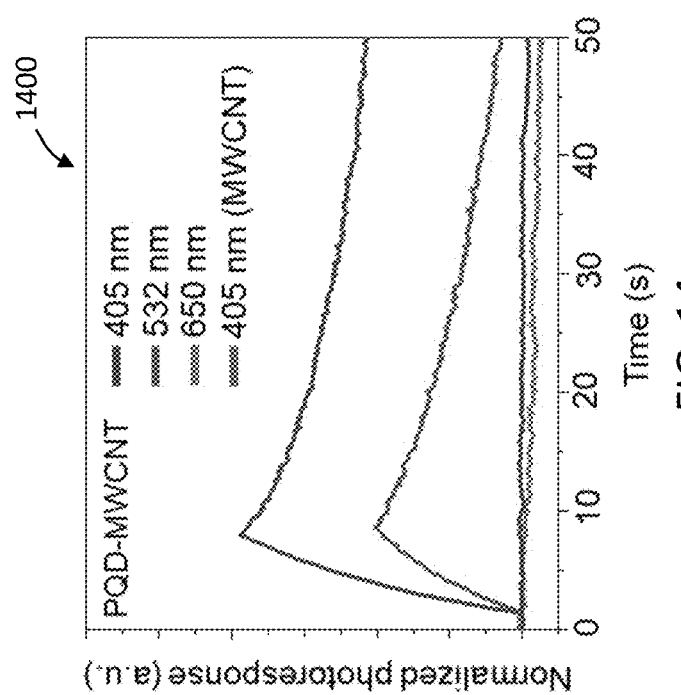
FIG. 14 is a graph of normalized photoresponse of PQD-MWCNT photonic synapse devices under different excitation wavelengths in accordance with one or more embodiments.

The light responses of the PQD-MWCNT device 1300 and neat MWCNT device (not shown) under different wavelengths are shown in graph 1400 of FIG. 14. In this example, the devices are illuminated for 6 seconds under a bias voltage of 0.5 V between two electrodes. The same applied voltage was used for all the experiments unless otherwise noted. For comparison, the data baseline is shifted to match for the PQD-MWCNT and MWCNT devices. To compare the light response at different wavelengths, all curves for the PQD-MWCNT devices are normalized with its incident light intensity at different wavelengths. There is no light response for the device with only MWCNTs (25 mW/cm2, which is the maximum output from the light source; 405 nm). In contrast, the PQD-MWCNT device 1300 shows significantly high photoresponse with orders of magnitude lower intensity than the value of 40 W/cm2 at 457 nm light required to get a reasonable response as reported previously for neat CNTs. Because the PQDs are known excellent photocarrier generators, the significant improvement in photoresponse for the PQD-MWCNT system is attributed to the presence of PQDs grown on MWCNTs. It can be seen that 405 nm gives the maximum light response. The PQD-MWCNT device 1300 shows almost no light response at 650 nm. Among the three wavelengths used (405 nm, 532 nm, and 650 nm), 405 nm shows the highest light response as well as the best photonic memory effect. The I-V curves of the PQD-MWCNT device 1300 of one or more embodiments under dark and 405 nm light are shown in graph 1500 of FIG. 15. The I-V curves indicate that the PQD-MWCNT device 1300 has an ohmic behavior without hysteresis.

Figures 16, 17:
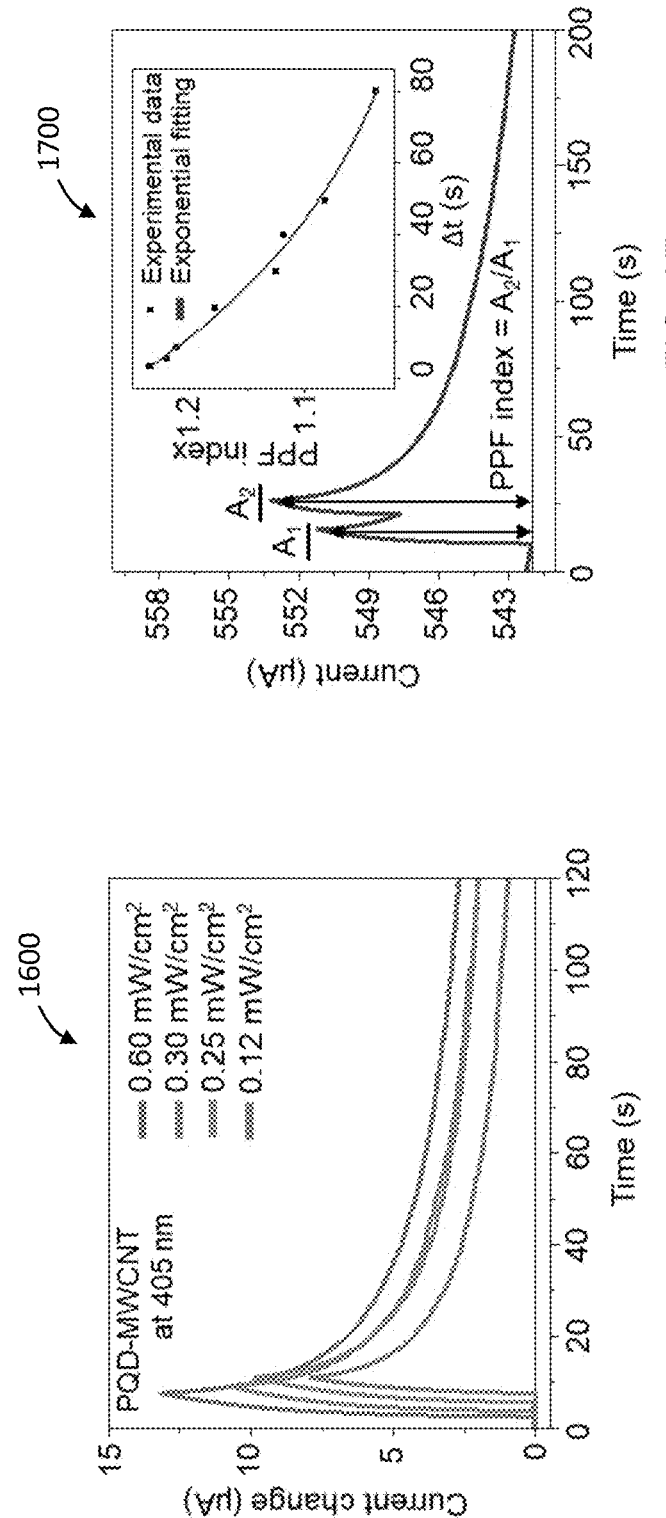
FIG. 16 is a graph of photoresponses of PQD-MWCNT photonic synapse devices at different intensities of 405 nm light in accordance with one or more embodiments.
FIG. 17 is a graph of pair pulse facilitation (PPF) index measurement including an inset figure showing the PPF index with respect to time interval between two pulses in accordance with one or more embodiments.

In biology, synapses are the functional links between the two neurons. When the pre-synaptic neuron gets excited by an environmental signal, it releases different amounts of neurotransmitters into the synaptic gap based on the different intensity of excitations. In general, once in the synaptic gap, the neurotransmitters diffuse to the post-synaptic neuron. The post-synaptic current value (in comparison to the pre-synaptic current) is an indicator of the synapse connection strength. For the bio-inspired optoelectronic synapse of one or more embodiments, light and electrical stimuli are a synapse analog to control the pseudo postsynaptic current. FIG. 16 shows a graph 1600 of the retention properties of the PQD-MWCNT device 1300 under different light intensities: 0.6, 0.3, 0.25, 0.125 mW/cm2, with 405 nm wavelength of light pulses (single pulse with 5 second duration). Under light stimuli of different intensities, the photonic memory strength is different (i.e. post-synaptic current strength in a biological system), which is analogous to a biological synapse where different pre-synaptic signals can influence the synapse connection strength.

Another aspect of the PQD-MWCNT device 1300 that is analogous to the biological synapse is that the PQD-MWCNT device 1300 transfers from short term memory to long term memory after light is turned off. In biology, short-term memory is a temporal memory that has a synapse connection strength that rapidly diminishes, and thus has a small synaptic weight. In contrast, long-term memory has a temporal memory synapse connection strength that diminishes much more slowly. In optoelectronic experiments performed on the PQD-MWCNT device 1300, as represented by graph 1600 of FIG. 16, immediately following the light stimulus (single pulse with 5 second duration), the current of the PQD-MWCNT device 1300 increases rapidly when the light is on and then decreases rapidly after the light is off over tens of seconds, resembling short-term memory. After several seconds of rapid signal decay, the current stabilizes, decreasing at a much slower rate, suggesting the PQD-MWCNT device 1300 transits from short-term memory to long-term memory.

FIG. 17 shows a graph 1700 representing one example of the pair pulse facilitation (PPF) property of the PQD-MWCNT device 1300 associated with the short-term memory effects of the PQD-MWCNT optoelectronic synapse of one or more embodiments. The PPF index is described by the ratio between the postsynaptic currents of the second light pulse and the first light pulse. In example shown in graph 1700, two identical 5 second light pulses were applied to the PQD-MWCNT device 1300 (0.125 mW/cm2 with 405 nm light). After the first 5 second pulse stimulus, the second 5 second pulse was applied after 10 seconds and enhanced the short-term memory and synaptic connection strength. The inset 1702 of FIG. 17 is obtained with exponential fitting by varying the interval of the two pulses and calculating the PPF index. The PPF index increases when the interval is short, which is due to the undiminished short-term photonic memory from photogenerated carriers from the first light pulse. The second light stimulus provides more photogenerated carriers that results in an increased device conductance. The PPF experiment results demonstrate that memory can be enhanced when repetitive training is performed, which is similar to how the brain memorizes new things. Therefore, when the PQD-MWCNT device 1300 is trained with multiple light pulses, the learning effect in the device can be enhanced.

In the biological brain, learning is achieved by adjusting the synaptic connection strength, which needs transition from short-term plasticity (STP) to long-term plasticity (LTP). Analogous to biological systems, the transition from STP to LTP could be achieved by applying pulse trains of stimulus that persistently increases the connection strength (i.e. synaptic weight). To evaluate the learning capabilities of the PQD-MWCNT device 1300, pulse trains were applied with 0.125 mW/cm2 intensity and increasing pulse durations at 405 nm light. The photonic memory transits from short-term memory to long-term memory after some time, similar to photoresponse shown in FIG. 16. For longer duration light pulses, it is easier for the device to saturate than with the same number of shorter pulses. The sooner the device saturates with light pulses, the more the device exhibits non-linear behavior. For neuromorphic computing, non-linearity is an important parameter that can affect the accuracy of pattern recognition tasks. In at least some instances, the synaptic weight may not increase linearly due to photoresponse saturation. For the same number of pulses, the non-linearity of a 1 second pulse duration is smaller than that of a 5 second pulse duration. Also, when longer pulses are used to stimulate the PQD-MWCNT device 1300, the number of states the PQD-MWCNT device 1300 can achieve, in at least some embodiments, may be smaller due to the saturation of the photoresponse. Since the number of states of the PQD-MWCNT device 1300, in at least some embodiments, can be regarded as the number of bits the PQD-MWCNT device 1300 can have, a smaller number of states may not be preferred for a single device to memorize complicated knowledge.

Figure 19:
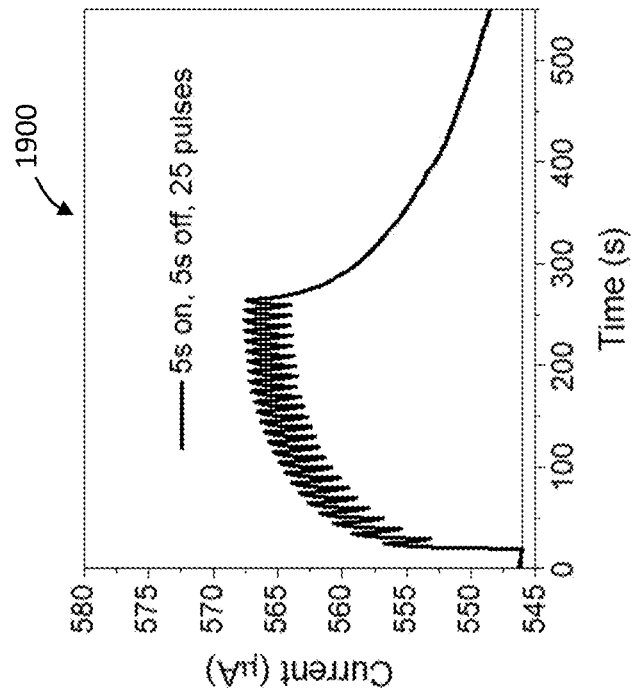
FIG. 19 is a graph of photonic memory of a PQD-MWCNT device under 25 pulses of 5 seconds duration in accordance with one or more embodiments.
Figure 18:
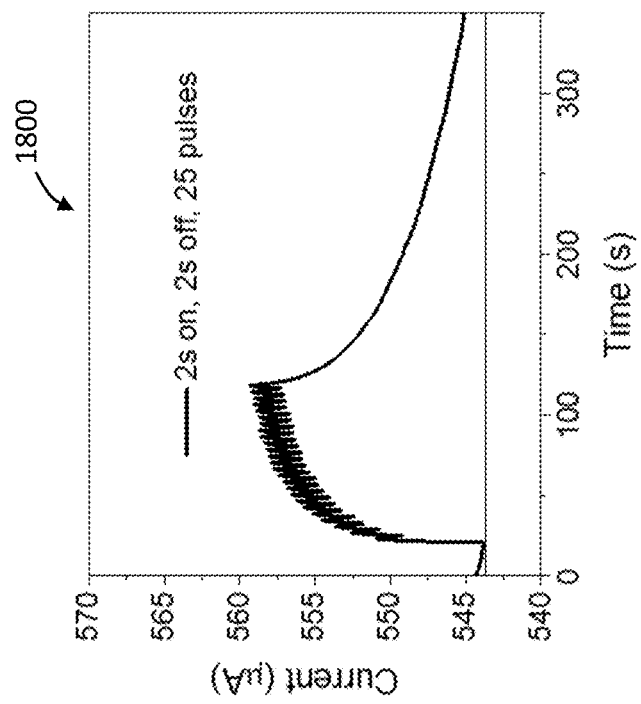
FIG. 18 is a graph of photonic memory of a PQD-MWCNT device under 25 pulses of 2 seconds duration in accordance with one or more embodiments.
Figure 21:
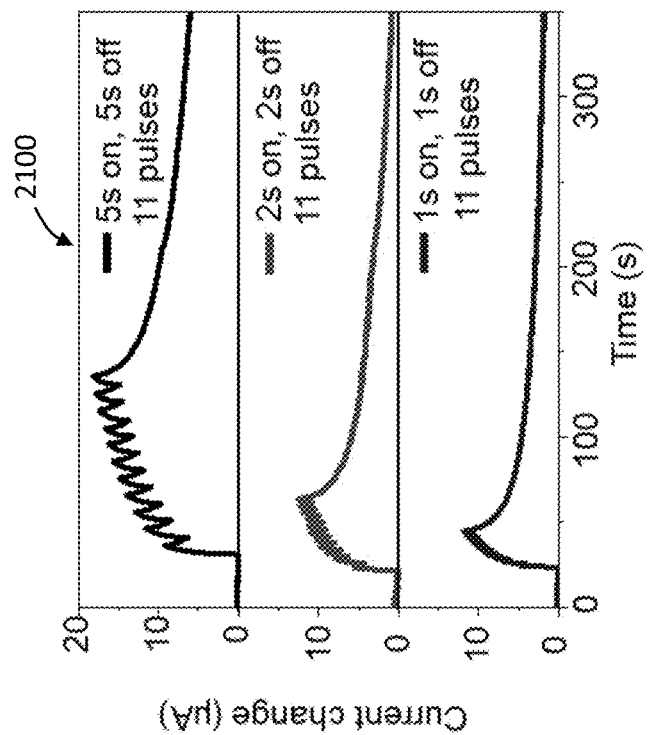
FIG. 21 is a graph of photonic memory of a PQD-MWCNT device after different duration of eleven (11) light pulses in accordance with one or more embodiments.
Figure 20:
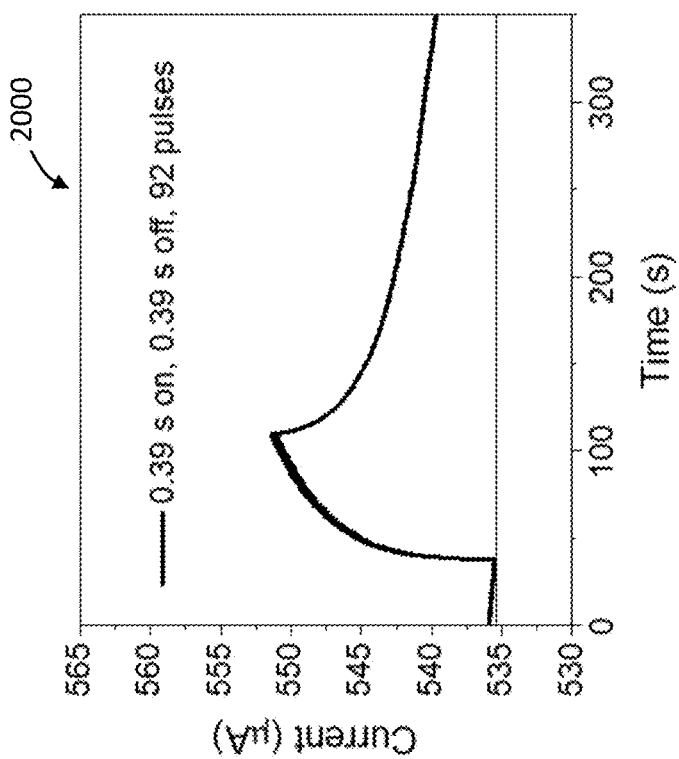
FIG. 20 is a graph of photonic memory of a PQD-MWCNT device under 92 pulses of 0.39 seconds duration in accordance with one or more embodiments.

Additional pulses with shorter pulse durations were also applied, as shown in graph 1800 of FIG. 18, graph 1900 of FIG. 19, and graph 2000 of FIG. 20 in which the non-linear weight change can be clearly seen compared to graph 2100 of FIG. 21, which shows the photonic memory of the PQD-MWCNT device 1300 after different duration of 11 light pulses. More specifically, graph 1800 of FIG. 18 is a graph of the photonic memory of the PQD-MWCNT device 1300 under 25 pulses of 2 second pulse durations; FIG. 19 is a graph of the photonic memory of the PQD-MWCNT device 1300 under 25 pulses of 5 second pulse durations; and FIG. 20 is a graph of the photonic memory of the PQD-MWCNT device 1300 under 92 pulses of 0.39 s pulse duration.

Figure 22:
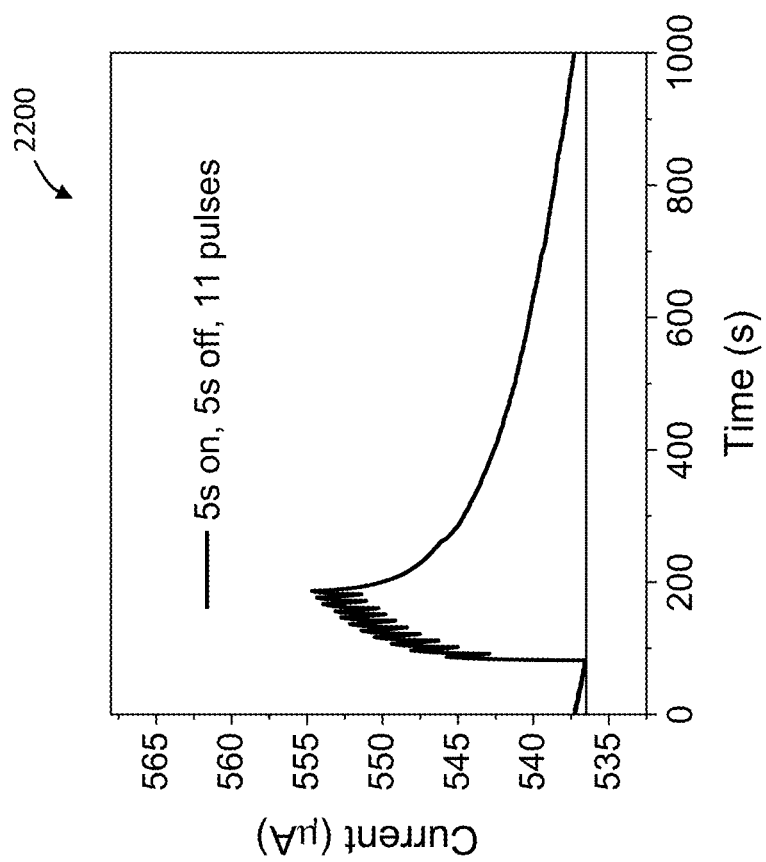
Figure 23:

FIG. 22 shows recoded LTP over longer periods with over 800 seconds of photonic memory to exemplify further trends in LTP of the devices. In some instances, the photoresponse time can be affected by light wavelength, light intensity and light pulse width, which is similar to other photodetector devices. Since the dynamic range (on/off) ratio is important for synapses in neuromorphic computers, a dark current deduction unit can be implemented after PQD-MWCNT device 1300 in practical applications to realize a large dynamic range. The energy consumption per synaptic event of optically stimulated synaptic device is calculated using the following relation:

$$dE = S \times P \times dt \tag{EQ1}$$

where S is the area of the device, P is the input light intensity, and dt is the pulse duration of a single light pulse. For the PQD-MWCNT device 1300, in one example, the energy for potentiation is 6.09 nJ for a pulse duration of 0.39 s. However, other configurations are applicable as well. A table comparing the energy consumption of the PQD-MWCNT device 1300 with other optoelectronic synapses is given in table 2300 of FIG. 23.

Figure 24:
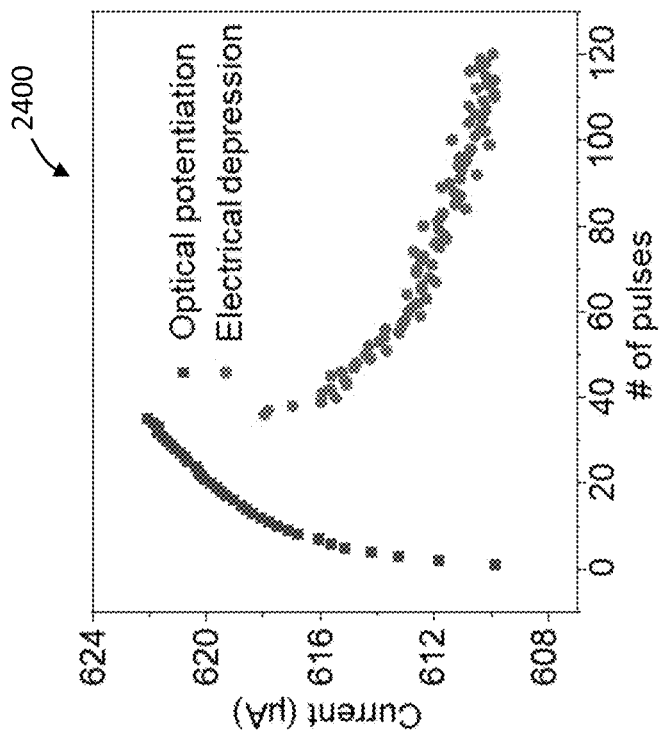
FIG. 24 is a graph of light potentiation and electrical depression to change the synaptic weight of a PQD-MWCNT device in accordance with one or more embodiments.

In real biological systems, the learning process needs not only synaptic connection strength-enhancing but also strength-weakening. As stated previously, the neurotransmitters released by the pre-synaptic neuron diffuse to the post-synaptic neuron. The post-synaptic neuron can be either excited or inhibited due to different neurotransmitters and receptors. Therefore, the optoelectronic synapse of one or more embodiments can also mimic both biological potentiation (synaptic weight increases; enhancing) and depression (synaptic weight decreases; weakening). In at least some embodiment, light pulses are used in the PQD-MWCNT device 1300 for potentiating the device 1300 to achieve excitatory post-synaptic current (EPSC). Electrical pulses, in at least some embodiments, are used for depressing the PQD-MWCNT device 1300 to achieve inhibitory post-synaptic current (IPSC). Graph 2400 of FIG. 24 shows light potentiation and electrical depression to change the synaptic weight of the device PQD-MWCNT device 1300.

Figure 25:
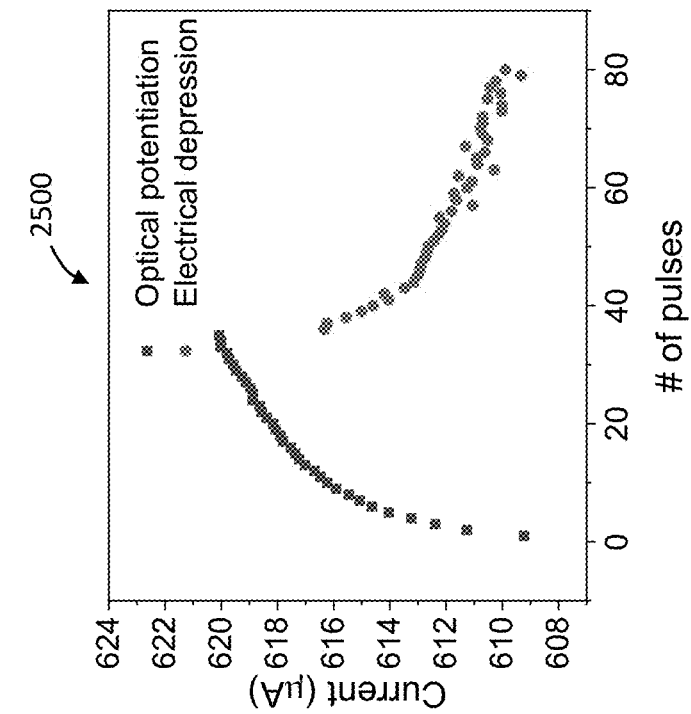
FIG. 25 is a graph of light potentiation and electrical depression to change the synaptic weight of the device with shorter electrical pulses compared to FIG. 24 in accordance with one or more embodiments.

In this example, potentiation is realized by applying 405 nm light pulse trains (0.125 mW/cm2 intensity) with each light pulse duration of 0.375 seconds and pulse period of 0.75 seconds, and the depression is realized by applying −1 V electrical pulses with each pulse width of 0.1 s and pulse period of 1 second. After the electrical pulse depression, the strengthened synaptic connection may be weakened. By increasing the electrical pulse width, the synaptic weight can be weakened faster. For example, graph 2500 of FIG. 25 shows light potentiation and electrical depression for changing the synaptic weight of the PQD-MWCNT device 1300 with shorter electrical pulses compared to FIG. 24. In two experiments, 35 light pulses were applied for potentiation (but with a 0.1 second pulse width) and 120 electrical pulses were required to depress the PQD-MWCNT device 1300 to the initial current level while only 80 electrical pulses with a 0.5 second pulse width was needed to do the same. This result suggests the feasibility of neuromorphic computing to train the neural network by varying widths of pulses to adjust the speed of the learning process. The potentiation and depression ability is what allows the PQD-MWCNT device 1300 to be considered as a potential synapse for optoelectronic neuromorphic computing.

The photonic memory of the PQD-MWCNT device 1300 may be explained by the trapped photocarriers in the PQD-MWCNT device 1300. There are three general regions where charge trapping may take place: defects in the PQDs 200 and MWCNTs 204, ligands attached to PQDs 202, and traps at the interface between the PQDs 202 and the MWCNT 204. The short-term memory is due to the electrons in shallow traps, while the long-term memory is likely due to those in deeper traps. In B. Pradhan et al., "Ultrasensitive and ultrathin phototransistors and photonic synapses using perovskite quantum dots grown from graphene lattice, Science Advances", Science Advances 2020, 6, eaay5225, which is incorporated by reference in its entirety, where PQDs are grown on graphene, the optoelectronic synapses did not show any memory effect without gate voltage (i.e., gate voltage is required to observe memory effects). However, in one or more embodiments, the PQD-MWCNT hybrid material 110 has photonic memory without any gate voltage. There are two overarching reasons why the PQD-MWCNT hybrid material 110 exhibits photonic memory in the absence of gate voltage. First, MWCNT has more defects compared to graphene, so the charges trapped in the MWCNT defects are more compared to graphene. Second, the charges trapped at the interface between PQDs and the MWCNT may provide a good photonic memory effect. The interface charge blocking results from the band bending due to the difference in the work functions of the materials.

Figure 28:
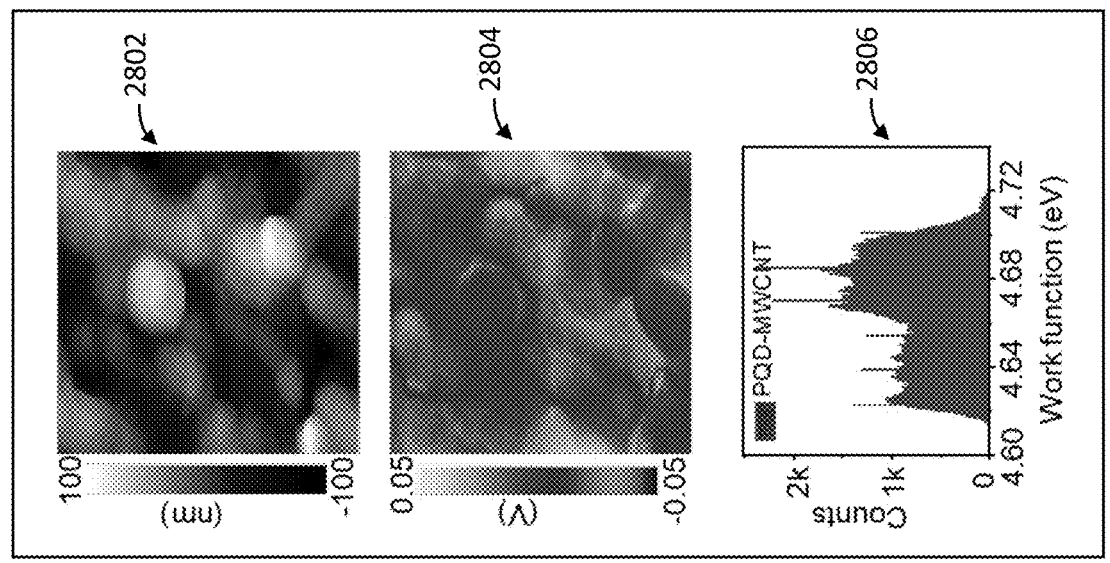
FIG. 28 illustrates KPFM measurement of work function for PQD-MWCNT material through an AFM image (1 μm×1 μm), a corresponding KPFM image (1 μm×1 μm), and a graph of calculated work function in accordance with one or more embodiments.
Figure 27:
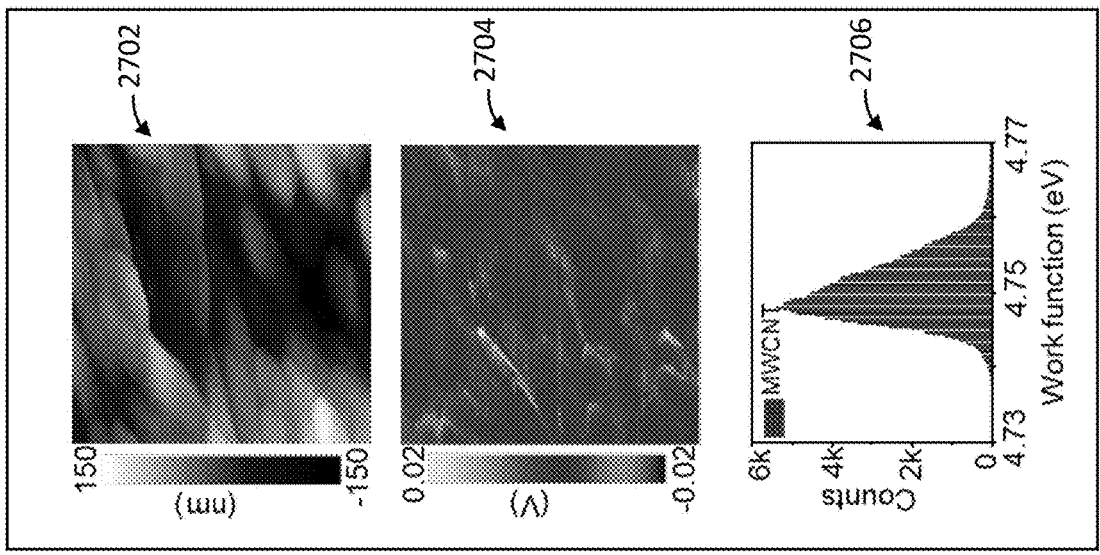
FIG. 27 illustrates KPFM measurement of work function for MWCNT material through an AFM image (1 μm×1 μm), a corresponding KPFM image (1 μm×1 μm), and a graph of calculated work function in accordance with one or more embodiments.
Figure 26:
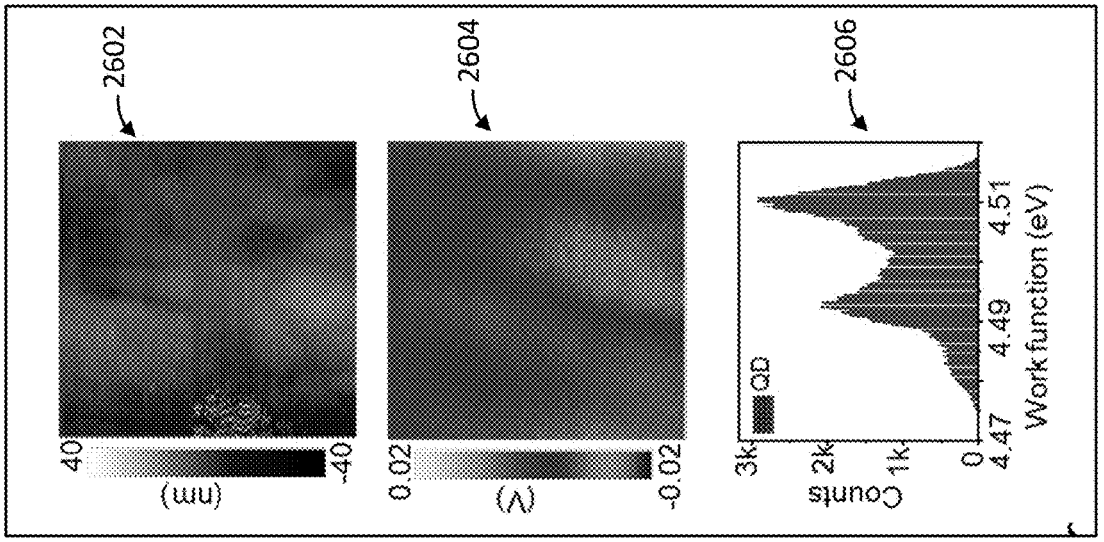
FIG. 26 illustrates Kelvin probe force microscopy (KPFM) measurement of work function for PQD material through an Atomic force microscopy (AFM) image (1 μm×1 μm), a corresponding KPFM image (1 μm×1 μm), and a graph of calculated work function in accordance with one or more embodiments.

To investigate the influence of work function, kelvin force probe microscopy (KPFM) was performed to determine the work functions and surface potential of MWCNT, PQD and PQD-MWCNT samples, as shown in FIG. 26 to FIG. 28. FIG. 26 includes an atomic force microscopy (AFM) image 2602 for a MWCNT sample, a corresponding KPFM image 2604 for the MWCNT sample, and a graph 2606 representing calculated work function for the MWCNT sample. FIG. 27 includes an AFM image 2702 for a PQD sample, a corresponding KPFM image 2704 for the PQD, sample and a graph 2706 representing calculated work function for the PQD sample. FIG. 28 includes an AFM image 2802 for a PQD-MWCNT sample, a corresponding KPFM image 2804 for the PQD-MWCNT sample, and a graph 2806 representing calculated work function for the PQD-MWCNT sample. In these examples, the surface topography of the materials was recorded in ambient conditions by AFM. KPFM measurements were performed using a two-pass method. During the first pass, the cantilever was mechanically driven at its resonant frequency to determine the topography of the sample. During the second-pass, the cantilever was lifted by a fixed distance (20 nm) to minimize the effect of short-range van der Waals forces and maximize the effect of long-range forces. The tip's work function ($\Phi_{tip}$) is initially measured by scanning a material of known work function: a freshly exfoliated surface of highly oriented pyrolytic graphite (HOPG; $\Phi_{HOPG}$=4.6 eV). Scanning the HOPG's surface provides the contact potential difference ($V_{CPD}$) between the tip and the HOPG. Using the relation, $\Phi_{HOPG}=\Phi_{tip}-eV_{CPD}$, where e is the electronic charge, Φtip is 4.73 eV. The samples (PQD, MWCNT and PQD-MWCNT) mounted on a metallic disc were then scanned in an area of 1 μm×1 μm at a scan rate of 1 Hz. Each sample was scanned at three different positions to confirm the work function value of the sample ($\Phi_{sample}$). The scanning provides the $V_{CPD}$ recorded between the tip and the sample. Using the relation, $\Phi_{sample}=\Phi_{tip}-eV_{CPD}$, $\Phi_{sample}$ is measured. The work function of MWCNT is ≈4.75 eV and that of PQDs is ≈4.50 eV, as shown in FIG. 26 and FIG. 27. FIG. 28 further demonstrates that the PQD-MWCNT 110 of one or more embodiments is a hybrid material that shows a work function between PQDs and MWCNTs.

Figure 29:
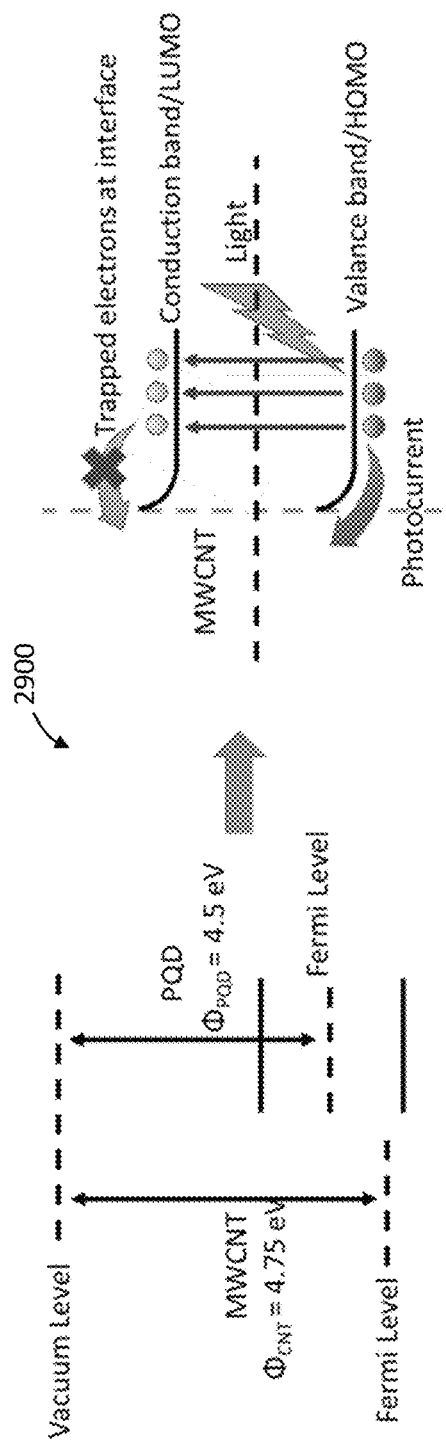
FIG. 29 is an illustration of an interface trapping mechanism of the PQD-MWCNT material in accordance with one or more embodiments.

Due to the difference in the work functions between the MWCNT and PQDs, the Fermi energy levels are aligned at the growth interface, as shown in FIG. 29, which illustrates the interface trapping mechanism 2900 of the PQD-MWCNT hybrid material 110 of at least some embodiments. As illustrated in FIG. 29, the band of two materials bends, which generates an internal electrical potential. The internal electrical potential makes the light-induced holes move to the MWCNT side, while the electrons are trapped in the PQDs. The light-induced holes contribute to the increased current of the PQD-MWCNT device 1300. Since the photogenerated electrons are blocked at the interface and cannot move into the MWCNT to recombine with the photogenerated holes, the photonic memory develops. Based on this result, it can be predicted that the larger the band bending at the interface, the better the ability of the interface to trap photocarriers. Unlike neat graphene with a work function around 4.56 eV, the Fermi energy level difference between MWCNT and PQD is much more than that between graphene and PQDs, and more photogenerated electrons could be trapped at the interface. This phenomenon further supports why PQD-graphene does not show any photonic memory under zero gate voltage; meaning that the Fermi energy level difference of the two materials is important for better memory effect. The larger the Fermi energy level difference is, the longer the photonic memory of the device might be.

Figure 30:
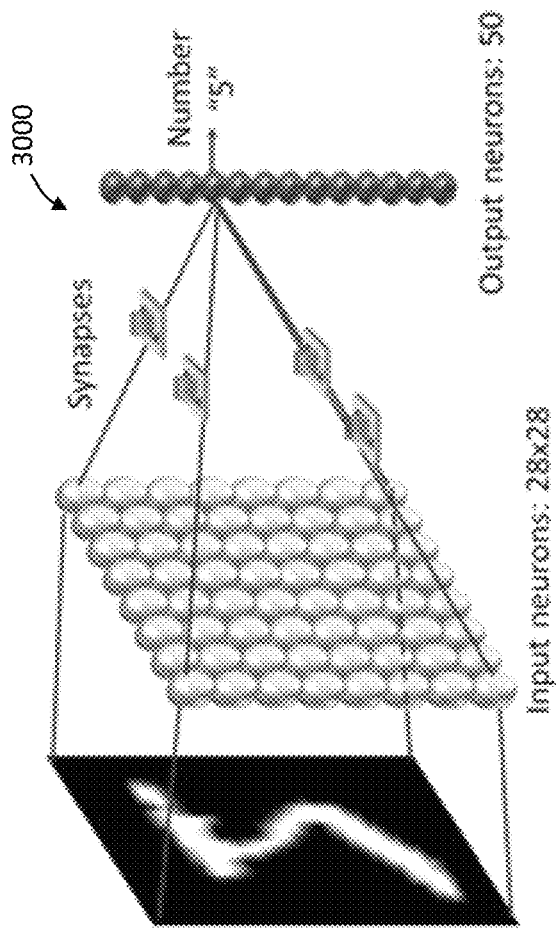
FIG. 30 illustrates a simulation structure for a spiking neural network in accordance with one or more embodiments.
Figure 31:
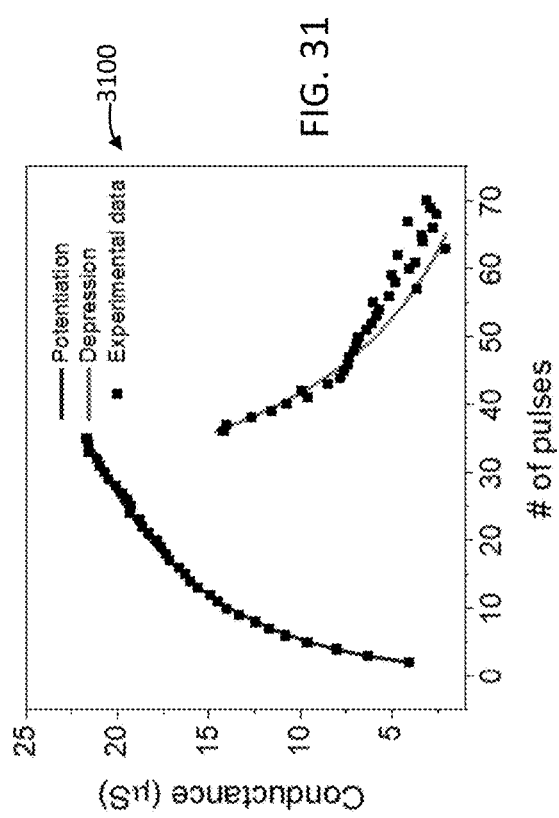
FIG. 31 is a graph of fitting of the conductance change versus pulse number after baseline correction in accordance with one or more embodiments.

To demonstrate that the PQD-MWCNT device 1300 can act as a synaptic building block in optoelectronic neuromorphic computers, pattern recognition is simulated by using the PQD-MWCNT device 100 as synapses between input and output neurons, as shown in the simulation structure of the spiking neural network 3000 in FIG. 30. Here, from MNIST dataset (a well-known handwritten dataset in machine learning), 2000 figures were chosen as the training set and 500 figures were chosen different from the training set as the test set. For the pattern recognition application of one or more embodiments, the fitted conductance curve of the PQD-MWCNT device 1300 is shown in graph 3100 of FIG. 31 after baseline correction. The fitting parameters for the conductance change of the PQD-MWCNT device 1300 are shown in Table 1 below.

TABLE 1

|  | a | b | c | Gmax (uS) | Gmin (uS) |
|---|---|---|---|---|---|
| Potentiation | −0.09267 | 4.14868 | 2.8315 | 22 | 0.001 |
| Depression | −0.49384 | 2.42035 | 1.4247 | 22 | 0.001 |

Figure 32:
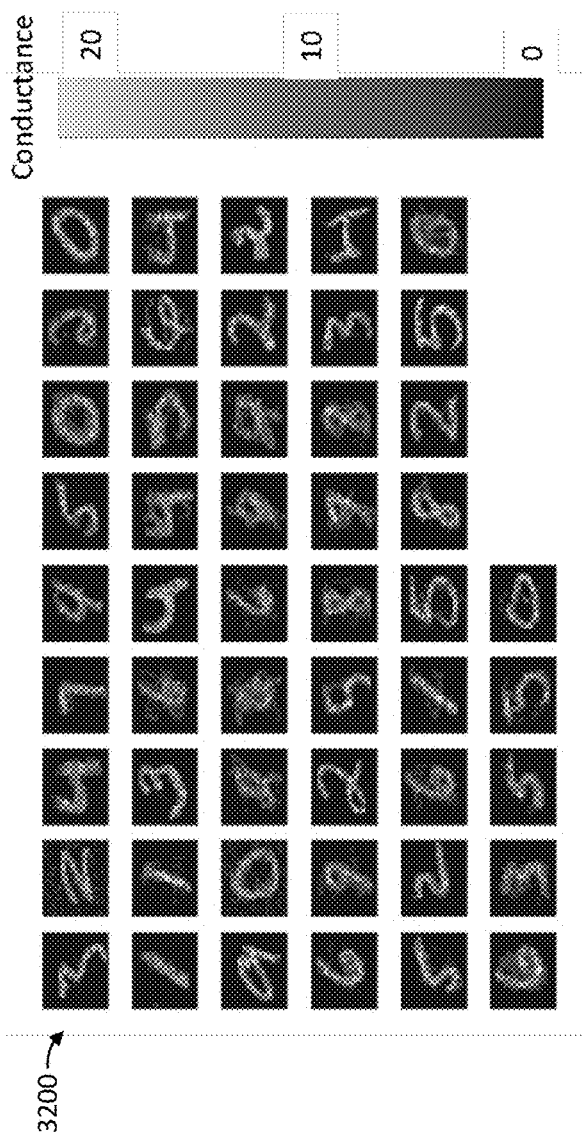
FIG. 32 is an illustration of synaptic weights of each output neuron of the spiking neural network of FIG. 30 in accordance with one or more embodiments.

The fitting represents how the PQD-MWCNT device 1300 changes synaptic weight during the training process in the simulation. In the simulation of at least some embodiments, a spiking neural network is constructed to perform unsupervised machine learning tasks similar to B. Pradhan et al. The details of the simulation are discussed in the Simulation Section below. The advantage of unsupervised machine learning compared to supervised machine learning is that the labeling process is not needed before training and the labeling can be done with a limited number of labeled data after training. Although the recognition rate in unsupervised machine learning is harder to achieve as high as supervised machine learning, the advantage of not requiring pre-training labels makes it adaptable for significant volumes of unknown natural data. FIG. 32 shows the synaptic weights 3200 of 50 output neurons of one or more embodiments after a 40-epoch (round) training. The synaptic weights 3200 indicate that the synapses of one or more embodiments catch some features of the training data. In this example, the accuracy is 52% with the test set based on the limited number of pulses shown in FIG. 31 since the number of states is directly related to the volume of knowledge the device is capable of remembering. Nonlinearity can also affect accuracy. However, large nonlinearity will result if the number of pulses is increased to obtain more number of states. However, large nonlinearity also reduces accuracy, as discussed before. If shorter pulses are used to avoid large nonlinearity of the synaptic weight change, the PQD-MWCNT device 1300 can obtain an additional number of states, thereby achieving more accurate results for the pattern recognition task.

Figure 33:
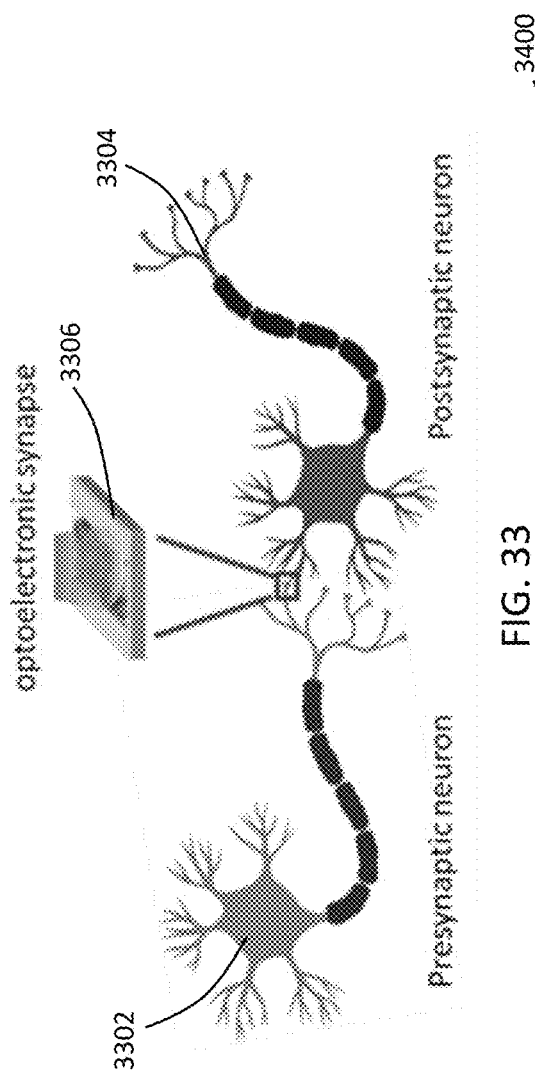
FIG. 33 is a schematic of interconnected synapses between a presynaptic neuron and a postsynaptic neuron in accordance with one or more embodiments.

FIG. 33 shows the anatomy of two biological neurons 3302, 3304 connected via a biological synapse 3306. As shown in FIG. 33, a synapse 3306 acts as a channel of communication between two neurons 3302, 3304. Information broadcasted from one neuron acting as presynaptic cell (transmitting neuron) 3302 is conveyed to the other acting as postsynaptic cell (receiving neuron) 3304 through the synapse 3306. The synaptic behavior can be strengthened (potentiated) or weakened (depressed) using appropriate triggers of optical pulses. Measurements of synaptic plasticity including short-term plasticity (STP), long term plasticity (LTP), and long-term depression (LTD) are emulated to resemble the synaptic behavior of its biological counterpart. In one or more embodiments, the optoelectric synapse device 1300 of one or more embodiments comprising the PQD-MWCNT hybrid material 110 acts as an artificial photonic synapse, where the presynaptic signal is the external light stimuli in the form of optical pulses and the postsynaptic signal is the current obtained across the PQD-MWCNT channel. This data is further used to demonstrate pattern recognition with the help of machine learning as discussed in the Simulation Details section below.

As described herein, one or more embodiments successfully combine the advantages of MAPbBr3 PQDs and MWCNTs to create a new PQD-MWCNT hybrid material that can be used, for example, to fabricate a two-terminal device for neuromorphic computing. The PQD-MWCNT device shows excellent photoresponse compared to the previous research on CNT optoelectronic synapses. The PQD-MWCNT device further shows a good light-induced memory effect from the interface charge trapping as revealed from the energy levels measured using KPFM analysis. The photonic memory mimics the strengthening of synaptic weight in a way that is similarly observed in the biological brain. By varying intensities, pulse number, and pulse width, synaptic properties that emulate the biological brain are obtained. These results are highly relevant for emerging neuromorphic computing applications. Erasing of the memory (memory depression) is achieved by applying electrical pulses, which is also important in the neuromorphic learning process. Moreover, using the weight change properties of the optoelectronic synapses of one or more embodiments, pattern recognition simulation is performed to demonstrate that the PQD-MWCNT device can act as building blocks in neuromorphic computers. Since the PQDs of one or more embodiments are grown on the wall of single MWCNT and each MWCNT after PQD growth acts as a single device to absorb light and transport electrons, the hybrid material described herein has great potential as a building block for future nanoscale or single MWCNT-based optoelectronic neuromorphic computing and sensing devices.

Process of Fabricating a Light Control Photonic Synapse in a Photodetector Geometry FIG. 35 is an operational flow diagram illustrating one example of a process/method 3500 for fabricating a light control photonic synapse device to act as an artificial photonic synapse in accordance with one or more embodiments. In one embodiment, the process 3500 is initiated at block 3502 in response to obtaining a semiconductor structure comprising a substrate. The substrate, in one embodiment, can comprise a material such as (but not limited to p+ silicon) having a thermally grown $SiO_2$ dielectric formed thereon. At block 3502, a PQD-MWCNT film is formed on the substrate. In at least one embodiment, forming the PQD-MWCNT film comprises combining a MAPbBr3 PQD precursor solution with MWCNTs to form PQD precursor droplets. The PQD precursor droplets are mixed to cause collisions with surfaces of the MWCNTs thereby initiating heterogeneous nucleation and subsequent growth of PQDs from the lattice of the MWCNTs. Combining the MAPbBr3 PDQ precursor solution with MWCNTs, in at least some embodiments, further includes combining in a toluene solution. In at least some embodiments, combining the MAPbBr3 PDQ precursor solution with MWCNTs is in an approximate ratio of 17.3 mg MABr+73 mg PbBr2+5 mL DMF+300 μL butylamine+500 μL oleic acid. In at least some embodiments, mixing of the PQD precursor droplets causes collisions with surfaces of the MWCNTs and overcomes an activation free energy for stable nucleation and crystal growth due to a high Gibbs free surface energy of the MWCNTs surface. The stable nucleation and crystal growth, in at least some embodiments, is primary at defect sites of surfaces of the MWCNTs. At block 3504, a first electrode and a second electrode are formed on the substrate, wherein the PQD-MWCNT film forms a PQD-MWCNT channel between the first electrode and the second electrode.

Operation of Photodetector Device as an Artificial Photonic Synapse

FIG. 36 is an operational flow diagram illustrating one example of a process/method 3600 for operating a device having a light control photodetector device geometry to act as an artificial photonic synapse in accordance with one or more embodiments. At block 3602, a presynaptic signal is applied as stimuli as one or more light pulses or electrical voltage on a perovskite quantum dots grown on multi-wall carbon nanotubes (PQD-MWCNT) channel between a first terminal and a second terminal. At block 3604 a current is measured across the PQD-MWCNT channel to represent a postsynaptic signal.

In at least some embodiments, applying the presynaptic signal as stimuli as one or more light pulses on the PQD-MWCNT channel includes applying one or more pulses at a first intensity while keeping a frequency of the one or more pulses at a given rate, and wherein the current measured across the PQD-MWCNT channel is a first current value. One or more light pulses, in at least some embodiments, are applied at a second light intensity are applied while keeping a frequency of the light pulses at the given rate, wherein the current measured across the PQD-MWCNT channel is a second current value. The second intensity is one of the same as or greater than the first intensity and the second current value is higher than the first current value.

In further embodiments, applying the presynaptic signal as stimuli as one or more light pulses on the PQD-MWCNT channel include applying one or more light pulses at a first frequency while keeping a light intensity of the light pulses at a given value and at a given wavelength of light. The current measured across the PQD-MWCNT channel is a first current value. One or more light pulses, in at least some embodiments, are applied at a second frequency while keeping a light intensity of the light pulses at the given value and at the given wavelength of light. The current measured across the PQD-MWCNT channel is a second current value, and the second frequency is one of the same as or greater than the first frequency and the second current value is higher than the first current value.

In other embodiments, applying the presynaptic signal as stimuli as one or more light pulses on the PQD-MWCNT channel comprises applying one or more light pulses at a first frequency while keeping a light intensity of the light pulses at a given value and at a given wavelength for a period of time until the current measured across the PQD-MWCNT channel is at constant current value representing a state of long term plasticity (LTP). One or more light pulses, in at least some embodiments, are applied to a terminal of the PQD-MWCNT channel and an increase in the current across the PQD-MWCNT channel is measured representing a state of long-term potentiation (LTP). Voltage pluses are applied to the terminal of the PQD-MWCNT channel and a decrease in the current across the PQD-MWCNT channel is measured representing long-term depression (LTD).

Experimental Section

One example of PQD-MWCNT hybrid material synthesis includes the following aspects. In at least one embodiment, 2 mg MWCNT (MWCNTs (>95%, OD: 10-20 nm) from US Research Nanomaterials, Inc) is put in 6 mL Toluene and sonicated with a probe sonicator under 25% power for 1 minute. Then 200 μL MAPbBr3 precursor (17.3 mg MABr+ 73 mg PbBr2+5 mL DMF+300 μL butylamine+500 μL oleic acid) is dropped into the MWCNT solution and the new MWCNT solution is sonicated for 5 mins to initiate PQD growth. After sonication, a waiting period of 30 mins occurs for the growth to be complete. After growth is complete, the washing process is repeated three times to purify the MWCNTs with PQDs from non-grown/solution grown PQDs. The washing process involves centrifugation of the solution at 3000 rpm for 10 mins followed by separation of PQD-MWCNTs from PQD solution and re-dispersing it in toluene for the next washing. After purification, the solution is sonicated for 5 mins to make MWCNTs well dispersed in the toluene for film making Additional details may be found in Li, J., Dwivedi, P., Kumar, K. S., Roy, T., Crawford, K. E. and Thomas, J. (2021), Neuromorphic Computing: Growing Perovskite Quantum Dots on Carbon Nanotubes for Neuromorphic Optoelectronic Computing (Adv. Electron. Mater. 1/2021). Adv. Electron. Mater., 7: 2170005, which is hereby incorporated by reference in its entirety.

Figure 34:
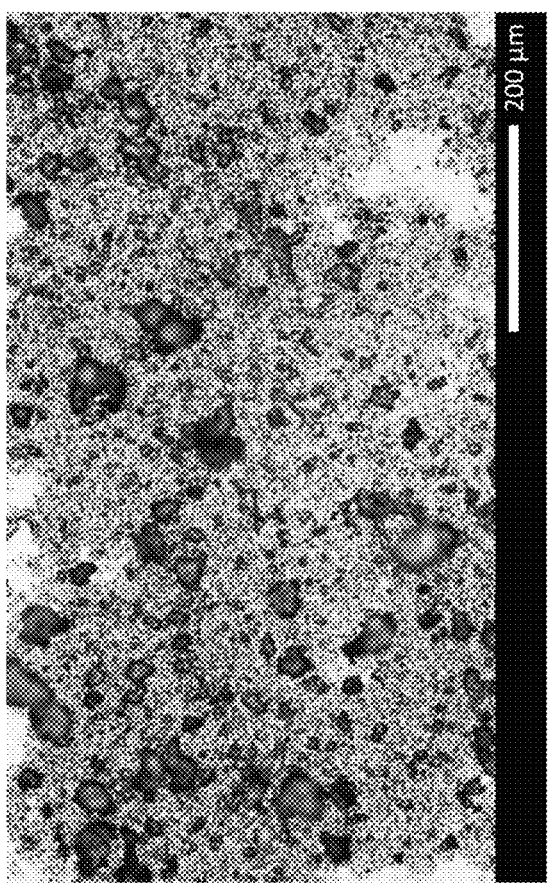
FIG. 34 is an image of the microscope image of our PQD-CNT film in accordance with one or more embodiments.

Device Fabrication:

The following is one example of a process for fabricating the PQD-MWCNT devices descried herein. In at least some embodiments, films of PQD-MWCNTs and MWCNTs are formed using spin coating to test their photoresponse in a device. To make the film more uniform, a very thin film of PVA (10% water solution) is spin-coated with a 3000 rpm spin speed before coating PQD-MWCNT. A microscope image 3400 of one example of the PQD-MWCNT film is shown in FIG. 34. Thermal evaporation can be used to deposit gold electrodes of the devices.

Material and Device Characterization:

Absorbance spectra and PL spectra of both solution and films were measured by Agilent Cary UV-Vis 300 and Horriba Nanolog FL3-11, separately. 405 nm excitation was used to obtain PL spectra. Renishaw RM 1000B Micro-Raman Spectrometer was used to measure Raman with 514 nm excitation source. XRD data was obtained by PANalytical Empyrean #2 with 1.8 KW Copper X-ray Tube. KPFM measurement was performed using NanoIR2 from Bruker with PR-EX-KPFM cantilevers and Platinum/Iridium coated tips. The device measurement was performed by Keithley 2636B equipment by using Labview.

Simulation Details

For the synapses of one or more embodiments, both optical pulses and electrical pulses can be used for changing the synaptic weights in the neuromorphic computers. For simulation, this is simplified by using Table 1 above to represent how the synapses change their weights during the simulation. In the simulated spiking neural network 3000, the input figures are coded by pulse trains, which act as the output from the input neurons. The input pulse trains go through the synapses with synaptic weights of one or more embodiments and reach the output neurons. The postsynaptic current is integrated by output neurons. If the summed post-synaptic current is beyond the threshold, the output neuron spikes. However, in the meantime, if the input pulse overlaps with the output spike, the synaptic weight is be increased based on the fitting parameters given in Table 1. Otherwise, the synaptic weight is decreased according to Table 1.

An increase or decrease of the device conductance related to synaptic weight is fitted by:

$$\Delta G = a_p + b_p e^{-c_p \frac{G-G_{min}}{G_{max}-G_{min}}}, \quad (EQ\ 2)$$

$$\Delta G = a_d + b_d e^{-c_d \frac{G_{max}-G}{G_{max}-G_{min}}}. \quad (EQ\ 3)$$

In the real biological system, the weight change of the synapse is affected by the time interval between the pre and post-synaptic spikes. In at least one embodiment, the time interval effect is not considered the simplified STDP learning rule is used.

Output neurons are leaky integrate-and-fire types and integrate current from the synapses and spike if the currents reach the threshold. The characteristic can be modeled by:

$$\frac{dV}{dt} = \frac{I_{post} - GV}{\tau}, \quad (EQ\ 4)$$

where V is the state variable (voltage) of the neuron, $I_{post}$ is the summed post-synaptic current, $\tau$ is a time constant. To mimic the homeostasis of the real biological system in the simulation of one or more embodiments, the following equation is included for output neurons:

$$\frac{dV_{th}}{dt} = \gamma(A - T), \quad (EQ\ 5)$$

where A is the mean firing rate of a neuron, T is the target firing rate and $\gamma$ is a constant. The role of homeostasis is to adjust the thresholds of neurons. In a biological system, the homeostasis is to adjust the thresholds of neurons. When the mean fire rate of an output neuron is above the target fire rate, the threshold of this neuron will increase. The function of homeostasis in the simulation is to make sure all the output neurons are used and make each one specialized for each stimulus.

Non-Limiting Examples

Although specific embodiments of the invention have been discussed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for operating a device having a light control photodetector device geometry to act as an artificial photonic synapse, the method comprising:
    applying a presynaptic signal as stimuli as one or more light pulses or electrical voltage on a perovskite quantum dots grown on multi-wall carbon nanotubes (PQD-MWCNT) channel between a first terminal and a second terminal; and
    measuring current across the PQD-MWCNT channel to represent a postsynaptic signal.

2. The method of claim 1, wherein applying the presynaptic signal as stimuli as one or more light pulses on the PQD-MWCNT channel comprises:

applying one or more pulses at a first intensity while keeping a frequency of the one or more pulses at a given rate, and wherein the current measured across the PQD-MWCNT channel is a first current value.

3. The method of claim 2, wherein applying the presynaptic signal as stimuli as one or more light pulses on the PQD-MWCNT channel further comprises:
applying one or more light pulses at a second light intensity while keeping a frequency of the light pulses at the given rate, wherein the current measured across the PQD-MWCNT channel is a second current value, wherein the second light intensity is one of the same as or greater than the first intensity and the second current value is higher than the first current value.

4. The method of claim 1, wherein applying the presynaptic signal as stimuli as one or more light pulses on the PQD-MWCNT channel comprises:
applying one or more light pulses at a first frequency while keeping a light intensity of the light pulses at a given value and at a given wavelength of light,
wherein the current measured across the PQD-MWCNT channel is a first current value.

5. The method of claim 4, wherein applying the presynaptic signal as stimuli as one or more light pulses on the PQD-MWCNT channel further comprises:
applying one or more light pulses at a second frequency while keeping a light intensity of the light pulses at the given value and at the given wavelength of light,
wherein the current measured across the PQD-MWCNT channel is a second current value, and
wherein the second frequency is one of the same as or greater than the first frequency and the second current value is higher than the first current value.

6. The method of claim 1, wherein applying the presynaptic signal as stimuli as one or more light pulses on the PQD-MWCNT channel comprises:
applying one or more light pulses at a given frequency while keeping an intensity of the light pulses at a given value and at a given wavelength for a period of time until the current measured across the PQD-MWCNT channel is at constant current value representing a state of long term plasticity (LTP);
applying one or more light pulses to a terminal of the PQD-MWCNT channel and measuring an increase in the current across the PQD-MWCNT channel representing a state of long-term potentiation (LTP); and
applying voltage pluses to the terminal of the PQD-MWCNT channel and measuring a decrease in the current across the PQD-MWCNT channel representing long-term depression (LTD).

7. The method of claim 1, further comprising:
using simplified spike-timing-dependent plasticity (STDP) to perform unsupervised machine learning for pattern recognition.

8. A light control semiconductor device to act as an artificial photonic synapse comprising:
a substrate; and
a perovskite quantum dots (PQD) directly grown on multi-wall carbon nanotubes (MWCNT) material disposed on the substrate and forming a PQD-MWCNT channel.

9. The light control semiconductor device of claim 8, wherein the substrate is a silicon substrate.

10. The light control semiconductor device of claim 8, wherein the PQDs comprise a methylammonium lead bromide material.

11. The light control semiconductor device of claim 8, wherein the PQD-MWCNT channel is a layer of PQD-MWCNT formed on a silicon oxide layer disposed on top of the substrate.

12. The light control semiconductor device of claim 8, further comprising:
a first electrode formed on a first side of the PQD-MWCNT channel; and
a second electrode formed on a second side of the PQD-MWCNT channel.

13. The light control semiconductor device of claim 8, wherein the PQD-MWCNT channel is a source-drain channel.

14. The light control semiconductor device of claim 13, further comprising:
a source electrode formed on a first side of the PQD-MWCNT source-drain channel; and
a drain electrode formed on a second side of the PQD-MWCNT source-drain channel.

15. A method for fabricating a light control photonic synapse device, the method comprising:
forming a perovskite quantum dots (PQDs) film on multi-wall carbon nanotubes (MWCNTs) by depositing PQDs directly on MWCNTs to form a POD-MWCNT film on a substrate; and
forming a first electrode and a second electrode on the substrate, wherein the PQD-MWCNT film forms a PQD-MWCNT channel between the first electrode and the second electrode.

16. The method of claim 15, wherein forming the PQD-MWCNT film comprises:
combining a MAPbBr3 (methylammonium lead tribromide) PQD precursor solution with MWCNTs to form PQD precursor droplets; and
mixing the PQD precursor droplets to cause collisions with surfaces of the MWCNTs thereby initiating heterogeneous nucleation and subsequent growth of PQDs from a lattice of the MWCNTs.

17. The method of claim 16, wherein combining of the MAPbBr3 PQD precursor solution with MWCNTs further includes combining in a toluene solution.

18. The method of claim 16, wherein the combining the MAPbBr3 PQD precursor solution with MWCNTs is in an approximate ratio of 17.3 mg MABr+73 mg PbBr2+5 mL DMF+300 μL butylamine+500 μL oleic acid.

19. The method of claim 16, wherein mixing the PQD precursor droplets to cause collisions with surfaces of the MWCNTs overcomes an activation free energy for stable nucleation and crystal growth due to a high Gibbs free surface energy of the surfaces of the MWCNTs.

20. The method of claim 19, wherein the stable nucleation and crystal growth is primary at defect sites of surfaces of the MWCNTs.

* * * * *